(12) United States Patent
Jiang

(10) Patent No.: US 11,388,491 B2
(45) Date of Patent: Jul. 12, 2022

(54) SYSTEMS AND METHODS FOR FAST WAVELENGTH SELECTION IN AN OPTICAL NETWORK

(71) Applicant: Zhiping Jiang, Kanata (CA)

(72) Inventor: Zhiping Jiang, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/079,323

(22) Filed: Oct. 23, 2020

(65) Prior Publication Data
US 2022/0132227 A1   Apr. 28, 2022

(51) Int. Cl.
*H04J 14/00* (2006.01)
*H04Q 11/00* (2006.01)
*H01S 5/50* (2006.01)

(52) U.S. Cl.
CPC ........... *H04Q 11/0005* (2013.01); *H01S 5/50* (2013.01); *H04Q 2011/0016* (2013.01)

(58) Field of Classification Search
CPC .... H04J 14/02; H04J 14/0212; H04J 14/0221; H04Q 11/0062; H04Q 11/0066; H04Q 11/0067; H04Q 11/0005; H01S 5/50; H01S 5/062; G02B 6/29395; G02B 6/29338
USPC ........ 398/79, 83, 45, 48, 49, 51, 53, 54, 56, 398/82, 158, 159; 385/24, 37, 16, 17, 18
See application file for complete search history.

(56) References Cited

U.S. PATENT DOCUMENTS

| | | | |
|---|---|---|---|
| 8,705,972 B2 * | 4/2014 | McLaren | G02B 6/12007 398/79 |
| 9,350,450 B2 | 5/2016 | Chen et al. | |
| 9,703,048 B2 | 7/2017 | Jiang | |
| 9,749,723 B2 | 8/2017 | Jiang et al. | |
| 10,243,722 B2 | 3/2019 | Jiang | |
| 2003/0228091 A1 * | 12/2003 | Lee | G02B 6/12019 385/18 |
| 2009/0003827 A1 * | 1/2009 | Kai | H04J 14/0246 398/45 |
| 2017/0010419 A1 | 1/2017 | Jiang | |

(Continued)

FOREIGN PATENT DOCUMENTS

CN  107408981 A  11/2017
CN  107925475 A  4/2018

OTHER PUBLICATIONS

Kai Shi, et. al., "System Demonstration of Nanosecond Wavelength Switching with Burst-mode PAM4 Transceiver", ECOC2019, PD3. 7, 2017.

*Primary Examiner* — Hanh Phan

(57) ABSTRACT

Systems and methods are described in an optical network. A system includes a first wavelength selector system having a first input port and a first output port, the first input port configured to receive a first set of multi-wavelength signals and the first output port configured to output a second set of multi-wavelength signals, the second set of multi-wavelength signals being a subset of the first set of multi-wavelength signals; a second wavelength selector system having a second input port and a second output port, the second input port configured to receive the second set of multi-wavelength signals and the second output port configured to output a final optical signal from the second set of multi-wavelength signals; and a controller coupled to the first wavelength selector system and the second wavelength selector system.

20 Claims, 17 Drawing Sheets

(56) References Cited

U.S. PATENT DOCUMENTS

2017/0230109 A1    8/2017   Kawai
2020/0328836 A1   10/2020   Koopferstock

\* cited by examiner

SYSTEMS AND METHODS FOR FAST WAVELENGTH SELECTION IN AN OPTICAL NETWORK

RELATED APPLICATIONS

This is the first patent application for the present disclosure.

TECHNICAL FIELD

The present application relates to optical communication networks, and in particular to systems and methods for fast wavelength selection in an optical network.

BACKGROUND

In optical telecommunication systems, optical networks are used to send and receive payload information in the form of optical signals transmitted through components (e.g., amplifier, multiplexer/de-multiplexer, etc.) and optical fibers connecting the components.

As intra-data center traffic increases at a rapid pace, traditional electronic switching is generally considered insufficient. New architectures have been proposed to improve data center performance, many taking advantage of the high bandwidth density of optics using various optical interconnect technologies. Optical interconnect technology can potentially provide advantages such as low cost, low latency, low power consumption, and large bandwidth. In particular, wavelength switching using optical switches is one solution, with relatively simple architecture.

An optical switch device is generally a multiport network bridge device which connects multiple optic fibers to each other and controls data packets routing between inputs and outputs. Some optical switches convert light to electrical data before forwarding it and converting it into a light signal again. Other optical switches can route and forward the light pulses themselves without any electrical conversion.

However, current optical switch technology fails to provide a fast wavelength tuning or selection system that is relatively cheap and easy to manufacture.

SUMMARY

The present disclosure describes system and methods in an optical network. In accordance to some aspect, an example system may include a first wavelength selector system having a first input port and a first output port, the first input port configured to receive a first set of multi-wavelength signals and the first output port configured to output a second set of multi-wavelength signals, the second set of multi-wavelength signals being a subset of the first set of multi-wavelength signals; a second wavelength selector system having a second input port and a second output port, the second input port configured to receive the second set of multi-wavelength signals and the second output port configured to output a final optical signal from the second set of multi-wavelength signals; and a controller coupled to the first wavelength selector system and the second wavelength selector system, where the controller is configured to control one or more switches in each wavelength selector system to select at least one of the second set of multi-wavelength signals and the final optical signal.

In some example embodiments, the first wavelength selector system may include: a first optical demultiplexer (DEMUX) device configured to receive and separate the first set of multi-wavelength signals into a plurality of groups of signals; and a first optical multiplexer (MUX) device configured to: receive the plurality of groups of signals via a first plurality of connections from the first optical DEMUX device, each group of signals being transmitted via a respective connection from the first plurality of connections; and output the second set of multi-wavelength signals, which may include a single group of signals from the plurality of groups of signals.

In some example embodiments, the first wavelength selector system may include: a semiconductor optical amplifier (SOA) as part of a connection from the first plurality of connections, wherein when the SOA is turned on by the controller, a respective group of signals passes through the SOA and is transmitted from the first optical DEMUX device to the first optical MUX device.

In some example embodiments, the first wavelength selector system may include a semiconductor optical amplifier (SOA) as part of each connection from the first plurality of connections.

In some example embodiments, the second wavelength selector system may include: a second optical demultiplexer (DEMUX) device configured to receive and separate the second set of multi-wavelength signals into a plurality of signals; and an output selector device configured to receive at least one of the plurality of signals via from the second optical DEMUX device and output the final optical signal from the at least one of the plurality of signals.

In some example embodiments, the second wavelength selector system may include: a semiconductor optical amplifier (SOA) as part of a connection from a second plurality of connections coupled with the second DEMUX device, wherein when the SOA is turned on by the controller, a signal passes through the SOA and is transmitted from the second optical DEMUX device to the output selector device.

In some example embodiments, the output selector device may include a second optical multiplexer (MUX) device or a reflector device.

In some example embodiments, the second wavelength selector system may include: one or more micro-ring resonators (MRRs), each MRR coupled to the first wavelength selector system and configured to: receive the second set of multi-wavelength signals; and select and output the final optical signal from the second set of multi-wavelength signals.

In some example embodiments, each MRR may be further coupled to a respective SOA to select and output the final optical signal.

In some example embodiments, the one or more MRRs may include two tunable MRRs, and when one of the two tunable MRRs is in operation to select the final optical signal of a specific wavelength, the other of the two tunable MRRs is being tuned for selection of a next wavelength.

In some example embodiments, the one or more MRRs may be further coupled to a second optical multiplexer (MUX) device or a reflector device.

In accordance to another aspect, there is provided a system in an optical network, the system may include: an optical demultiplexer (DEMUX) having a first input port and a plurality of output ports, the first input port configured to receive a first set of multi-wavelength signals and the plurality of output ports configured to output a plurality of group of signals, each group of signals being output from a respective port from the plurality of output ports; a plurality of MRR channel selectors, each MRR channel selector being coupled to a respective port from the plurality of output ports of the optical DEMUX and configured to select a signal of a specific wavelength from a respective group of signals from the coupled respective port; an optical MUX device or a reflector device coupled to the plurality of MRR channel selectors and configured to output a final optical signal from the output of the plurality of MRR channel selectors; and a controller coupled to the plurality of MRR channel selectors, wherein the controller is configured to control the plurality of MRR channel selectors to select the final optical signal.

In some example embodiments, each MRR channel selector may include one or more micro-ring resonators (MRRs), each MRR coupled to the respective port from the plurality of output ports of the optical DEMUX and configured to: receive the respective group of signals from the coupled respective port; and select and output the final optical signal from the respective group of signals.

In some example embodiments, each MRR is further coupled to a respective SOA to select and output the final optical signal.

In some example embodiments, each MRR channel selector may include two tunable MRRs, and when one of the two tunable MRRs is in operation to select the final optical signal of a specific wavelength, the other of the two tunable MRRs is being tuned for selection of a next wavelength.

According to some example aspects, the present disclosure describes a method in an optical network. The method may include: receiving a first set of multi-wavelength signals by a first optical DEMUX device; separating the first set of multi-wavelength signals into a plurality of groups of signals by the first optical DEMUX device; selecting a group of signals from the plurality of groups of signals by a SOA; outputting the selected group of signals by a first optical MUX device that is coupled to the first optical DEMUX device and the SOA; receiving the selected group of signals by a wavelength selector system that is coupled to the first optical MUX device; and selecting and outputting a final optical signal of a specific wavelength from the selected group of signals by the wavelength selector system.

In some example embodiments, the wavelength selector system may include a second optical DEMUX device, a SOA and an output selector device, and selecting and outputting the final optical signal of a specific wavelength from the selected group of signals may include the steps of: receiving the selected group of signals by the second optical DEMUX device coupled to the first optical MUX device; selecting the final optical signal of the specific wavelength by the SOA coupled to the second optical DEMUX device; and outputting the final optical signal by the output selector device coupled to the second optical DEMUX device.

In some example embodiments, the output selector device includes a second optical MUX device or a reflector device.

In some example embodiments, the wavelength selector system includes two tunable MRRs and an output selector device, and selecting and outputting the final optical signal of a specific wavelength from the selected group of signals may include the steps of: receiving the selected group of signals by the two tunable MRRs coupled to the first optical MUX device; selecting the final optical signal of the specific wavelength by the two tunable MRRs; and outputting the final optical signal by the output selector device coupled to the two tunable MRRs.

In some example embodiments, the output selector device may include a second optical MUX device or a reflector device.

In some example embodiments, the wavelength selector system may include two SOAs, with each SOA coupled to a respective tunable MRR, and wherein the method may include providing a power gain by at least one SOA to amplify the final optical signal.

BRIEF DESCRIPTION OF THE DRAWINGS

Reference will now be made, by way of example, to the accompanying figures which show example embodiments of the present application, and in which.

Like reference numerals are used throughout the Figures to denote similar elements and features. While aspects of the invention will be described in conjunction with the illustrated embodiments, it will be understood that it is not intended to limit the invention to such embodiments.

DETAILED DESCRIPTION OF EXAMPLE EMBODIMENTS

Optical networks may be utilized to meet the increasing demand for bandwidth and flexibility of communications networks. In particular, wavelength-division multiplexing (WDM) technology may be used for bulk transport of high-bandwidth signal and services.

For optical networks, a payload or data to be transmitted is conveyed in the optical signal by modulating the light source either directly or by using an external modulator.

Generally speaking, the bandwidth of a transmission medium can be more effectively used by means of multiplexing techniques. In WDM, signal carriers (i.e., channels) of different wavelength can be multiplexed into a (single) set of multi-wavelength signal for transmission using a single optical fiber. In this way, the bandwidth of the fiber is more effectively exploited by dividing it into non-overlaying spectral bands.

Figure 1A:
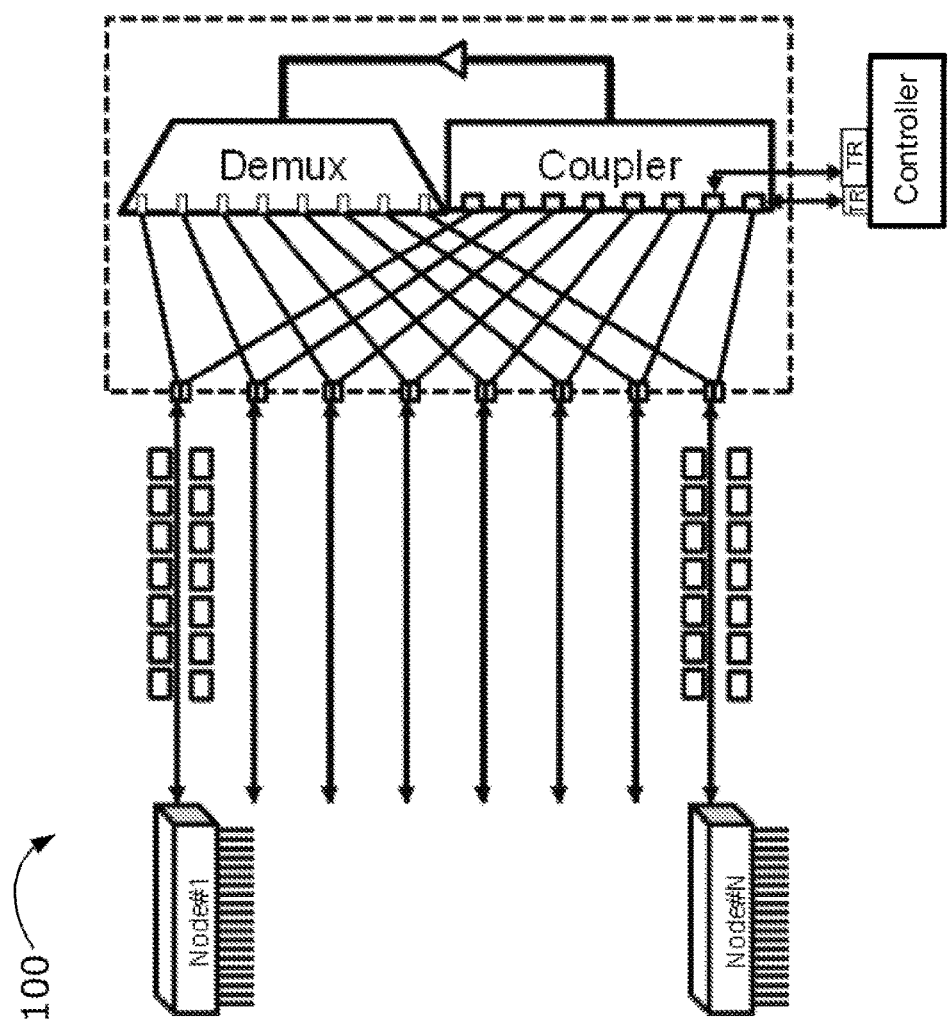
FIG. 1A illustrates a prior art optical switch system.

For example, FIG. 1A illustrates a prior art system 100 for distributing multiple channels, each of a different wavelength, to an appropriate node among a plurality of nodes. The system 100 contains a fast wavelength tunable laser, which may achieve a wavelength switching time of 10~50 nanoseconds (ns), which is not fast enough for applications requiring a switching time of 1ns or less.

Figure 1B:
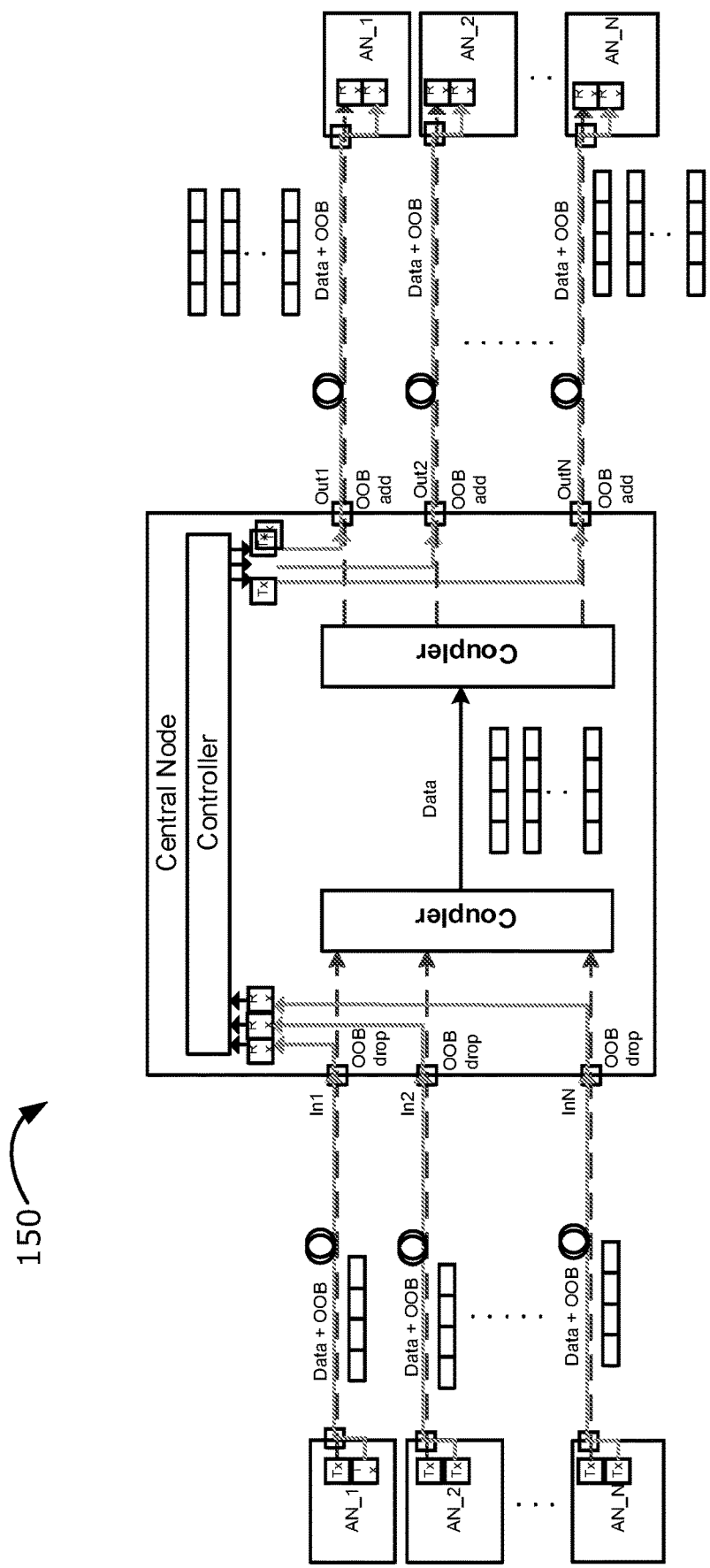
FIG. 1B illustrates another prior art optical switch system.

For another example, FIG. 1B illustrates an optical interconnecting network architecture 150, which is also prior art. The architecture involves a central node coupled to multiple access nodes (ANs), in which the central node includes a pair of optical couplers used to combine optical signals received from the ANs and broadcast the combined optical signals to all destination ANs. A coherent detection receiver in each of the ANs receives the combined optical signals and selectively detects a wavelength carrying the optical signal assigned to that AN by tuning a local oscillator (LO) wavelength of the coherent detection receiver. This system is described in U.S. Pat. No. 10,243,722 B2, herein incorporated by reference in its entirely. The optical switching time of the system described in U.S. Pat. No. 10,243,722 B2 is mostly determined by the speed of laser wavelength tuning or selection, and the coherent receiver's convergence time.

For yet another example, U.S. Pat. No. 9,703,048 B2, herein incorporated by reference in its entirely, describes an example apparatus for tuning optical components, which may include a plurality of tunable components, each having an optical output. The apparatus may also include a switch that during each period of a plurality of periods has a switch output that contains a selected one of the optical outputs. The apparatus may operate such that during each period of the plurality of periods, at least one of the tunable components other than the tunable component having the selected optical output is available for tuning. However, this apparatus uses micro-ring resonator for large tuning ranges, which means the time required for optical switching may be much larger than ins, most likely larger than microsecond.

Throughout this disclosure, the term "coupled" may mean directly or indirectly connected, or operably connected; the term "connection" may mean any operable connection, including direct or indirect connection. In addition, the phrase "coupled with" is defined to mean directly connected to or indirectly connected through one or more intermediate components. Such intermediate components may include both or either of hardware and software-based components. Furthermore, a "connection" or "operable connection" may include an optical connection, an electrical connection, a mechanical connection, or any combination thereof.

Further, a communication interface may include any operable connection. An operable connection may be one in which signals, physical communications, and/or logical communications may be sent and/or received. An operable connection may include a physical interface, an electrical interface, and/or a data interface.

Figure 2:
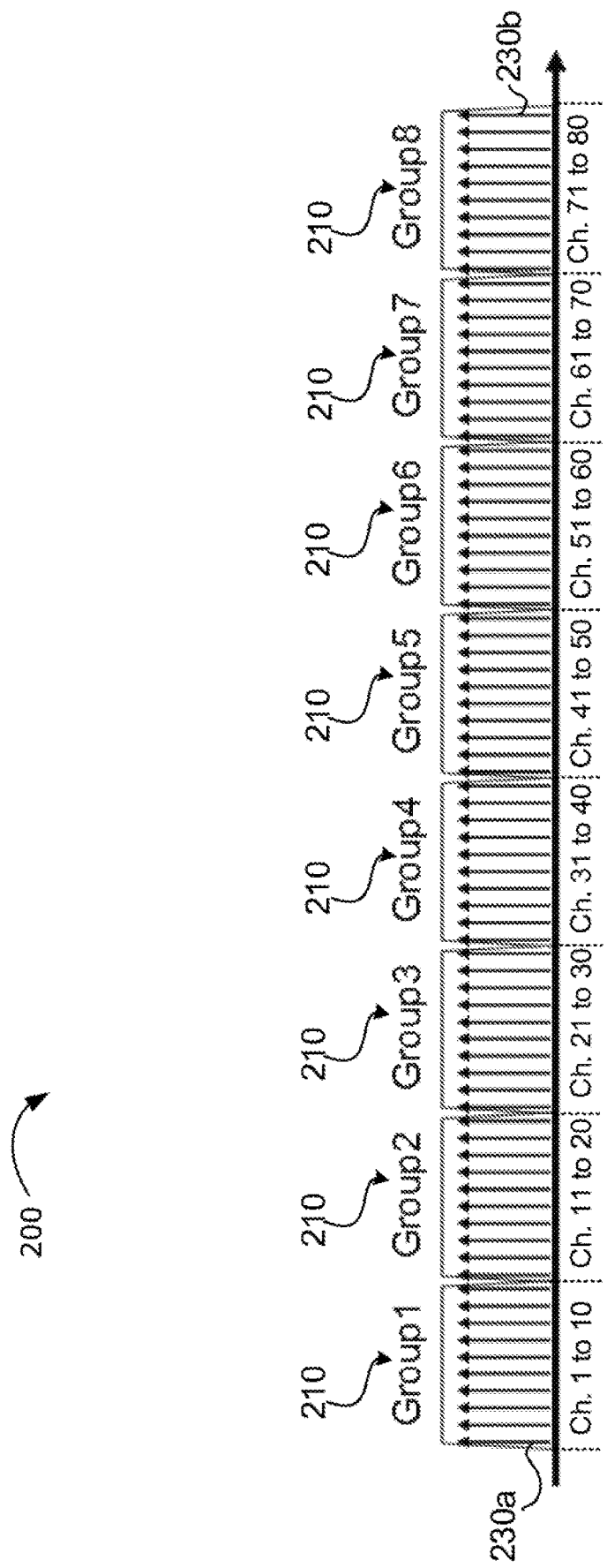
FIG. 2 illustrates an example set of wavelength signals of different wavelengths.

FIG. 2 illustrates a plurality of wavelength signals 230a, 230b. A set of multi-wavelength signals 200 may include a plurality of wavelength signals 230a, 230b. For example, FIG. 2 shows 80 wavelength signals, which may be in a C-Band (conventional band, ranging from approx. 1530 to 1565 nm). C-band optical channels tend to have the lowest loss and thus are commonly used in many long-haul, ultra-long-haul, and submarine optical transmission systems combined with the WDM technologies.

A multiplexer (MUX) device may operate to combine two or more separate inputs (e.g. different wavelength signals) into a single, aggregate signal transported via a single transmission channel. The different wavelength signals may, after being multiplexed by an optical multiplexer (MUX) device at the source, share a single common optical fibre as a set of multi-wavelength signals 200 for transmission from the source to a destination. Upon arriving at the destination, the set of multi-wavelength signals 200 need to processed for selection of a single wavelength signal.

Instead of selecting a wavelength signal from the entire set of multi-wavelength signals 200 in one step, the present disclosure provides a system and a method for first dividing the wavelengths into a plurality of groups 210, and then selecting one specific wavelength signal 230a, 230b from a group among the plurality of groups 210. For example, in the 50 GHz spaced system, 80 wavelength signals may be grouped into eight groups 210, each having ten wavelength signals, as shown in FIG. 2. Group 1 may be channels 1 to 10, group 2 may be channels 11 to 20, group 3 may be channels 21 to 30, and so on.

Figure 3A:
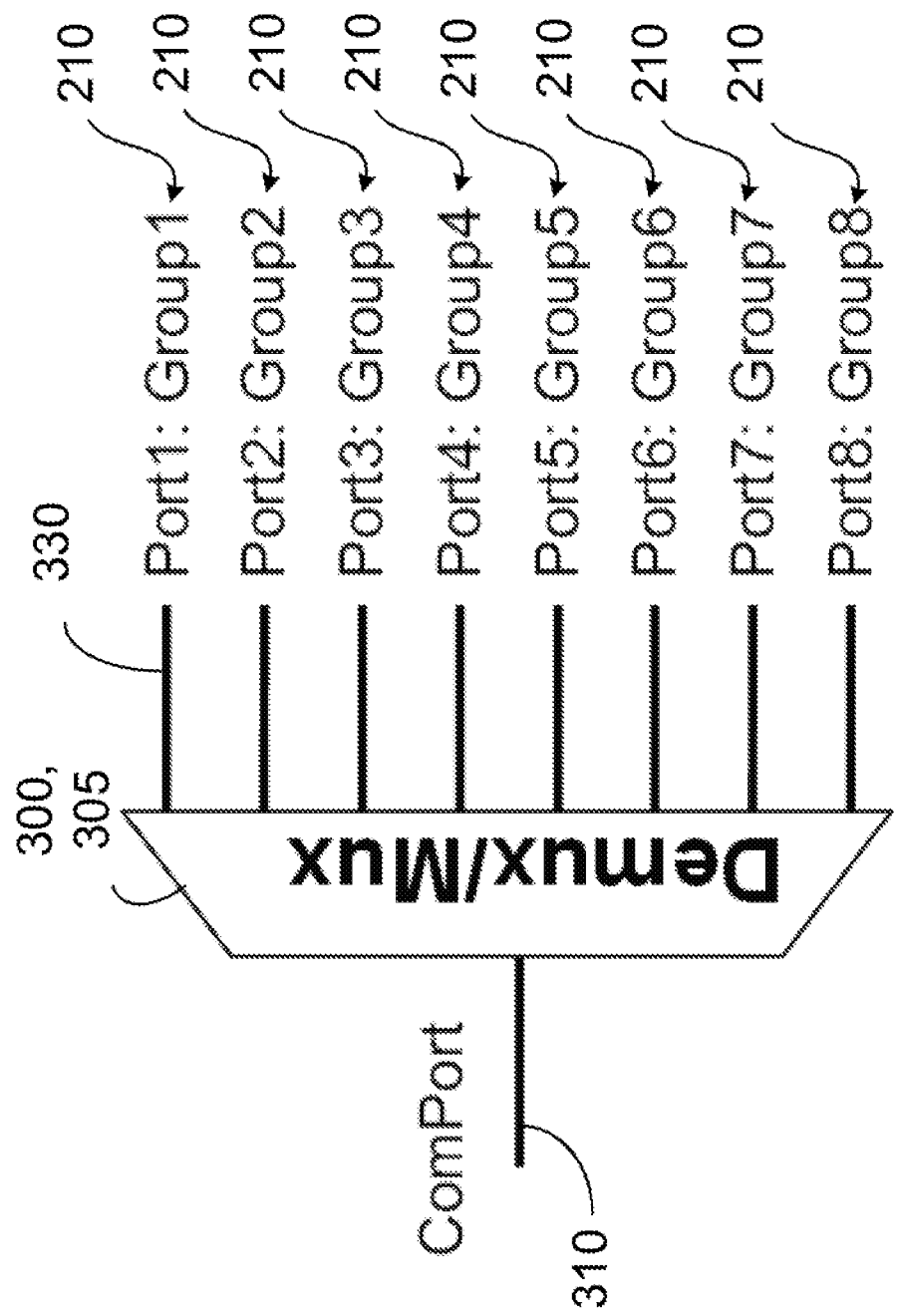
FIG. 3A illustrates an example optical switch device, e.g., a DEMUX/MUX device.

An apparatus as shown in FIG. 3A include an example optical switch device 300 used for separating a first set of (previously multiplexed) multi-wavelength signals into to a plurality of groups 210. The DEMUX device 300 has an input port 310 for receiving the first set of multi-wavelength signals 200 through a common channel, and a plurality of output ports 330 for outputting multiple groups 210. In some embodiments, each output port 330 may output a respective group 210, each group 210 including a subset of multi-wavelength signals from the first set of multi-wavelength signals. For example, as shown in FIG. 3A, output port 1 may output group 1 signals (from FIG. 2), output port 2 may output group 2 signals, output port 3 may output group 3 signals, and so on. Each group 210 may contain a subset of consecutive wavelength signals (or signals from consecutive wavelength channels) that are multiplexed to be transmitted to the next optical network component (e.g. a MUX device).

Often a multiplexer (MUX) and a demultiplexer (DE-MUX) can be combined into a single device (DEMUX/MUX or MUX/DEMUX) to process both incoming and outgoing signals. Throughout the disclosure, a DEMUX/MUX device may refer to either a DEMUX device 300 or a MUX device 305.

Figure 3B:
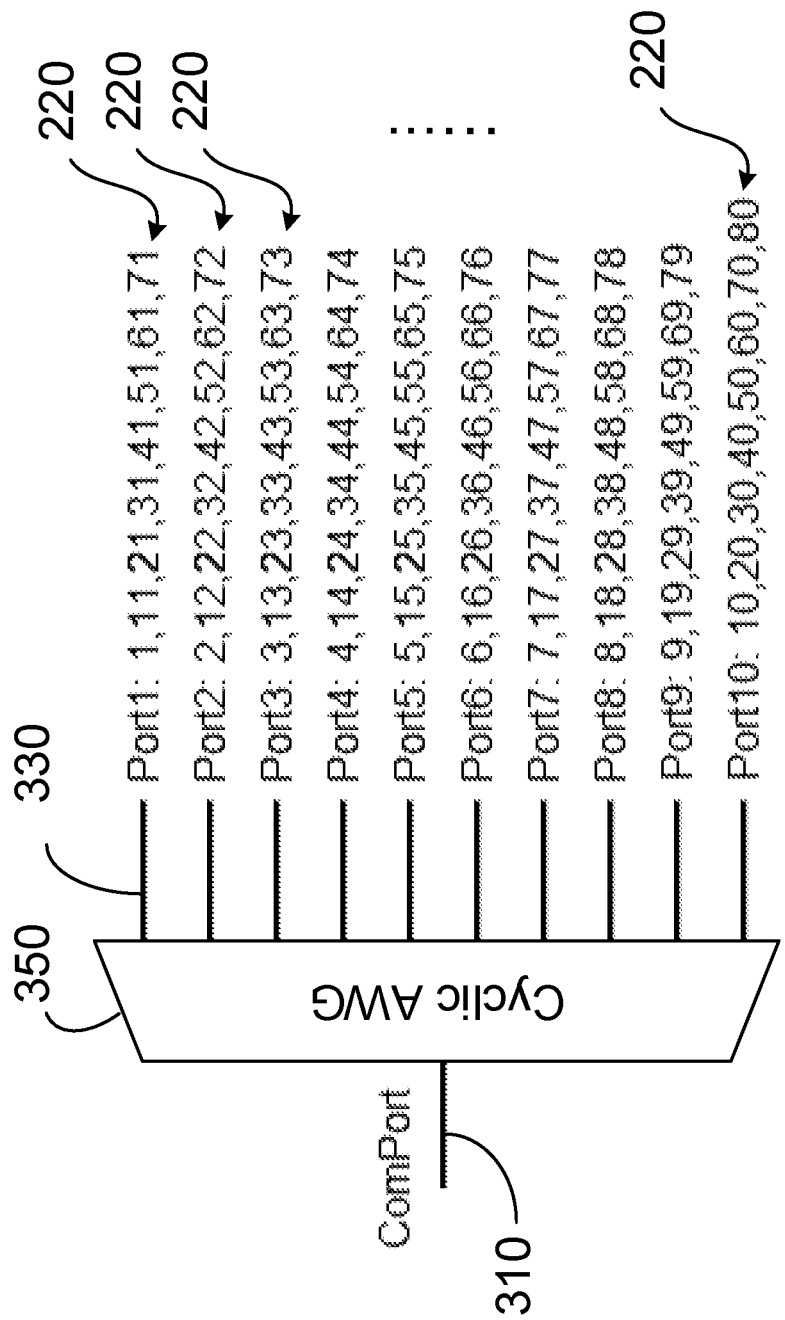
FIG. 3B illustrates another example optical switch device, e.g., a cyclic arrayed waveguide grating (AWG) device.

FIG. 3B illustrates another apparatus for separating a first set of (previously multiplexed) multi-wavelength signals into to a plurality of groups 220, using the cyclic arrayed waveguide grating (AWG) device 350. The cyclic AWG device 350 can receive the multi-wavelength signals 200 via input port 310, and output the plurality of groups 220 via output ports 330, each group 220 containing a subset of wavelength signals (or signals from consecutive wavelength channels) that are multiplexed to be transmitted to the next optical network component (e.g. a MUX device). Instead of grouping signals from consecutive wavelength channels, when wavelength channels 1 to 80 are present at the input port 310, signals from wavelength channels 1, 11, 21, 31, 41, 51, 61, 71 would appear at output port 1, wavelength channels 2, 12, 22, 32, 42, 52, 62, 72 would appear at output port 2, and so on. In this example, the Free Spectrum Range (FSR) is ten channels spaced at 50 GHz.

Figure 4A:
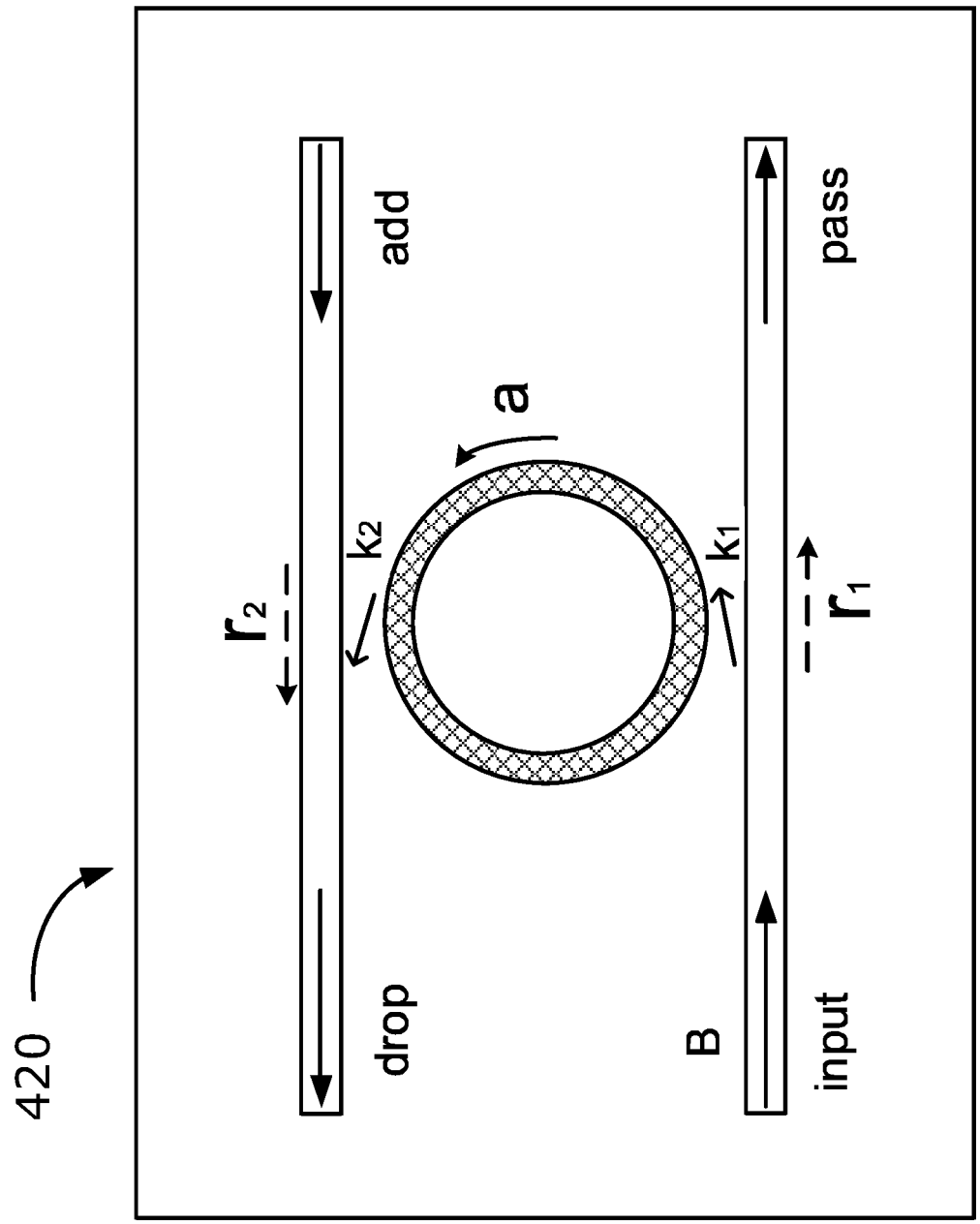
FIG. 4A illustrates an example schematic diagram for a micro-ring resonator (MRR).

FIG. 4A illustrates an example schematic diagram 420 for a micro-ring resonator (MRR). MRR is a resonant structure with a ring radius on the order of 10 um. In some example embodiments, a MRR may be made with silicon photonics. A single ring structure is shown in FIG. 4A, where $r_1$, $r_2$ are the self-coupling coefficients, $k_1$, $k_2$ are the cross-coupling coefficients, a is the single-pass amplitude transmission, including both propagation loss in the ring and loss in the couplers, a relates to the power attenuation coefficient $\alpha[1/cm]$ as $a^2 = \exp(-\alpha L)$, and L is the roundtrip length of the ring. For the drop port, the power transmission is given by $$T_d = \frac{(1-r_1^2)(1-r_2^2)a}{1 - r_1 r_2 a \cos\phi + (r_1 r_2 a)^2} \qquad (1)$$

where $\phi = \beta L$ is the single-pass phase shift, and $\beta$ is the propagation constant of the circulating mode in the MRR.

In general, if a MRR acts fast to tune and select a specific wavelength signal, then the selection range for the MRR tends to be small; and when MRR is slow to tune and select a specific wavelength signal, it can select from a larger set of wavelength signals.

Figure 4B:
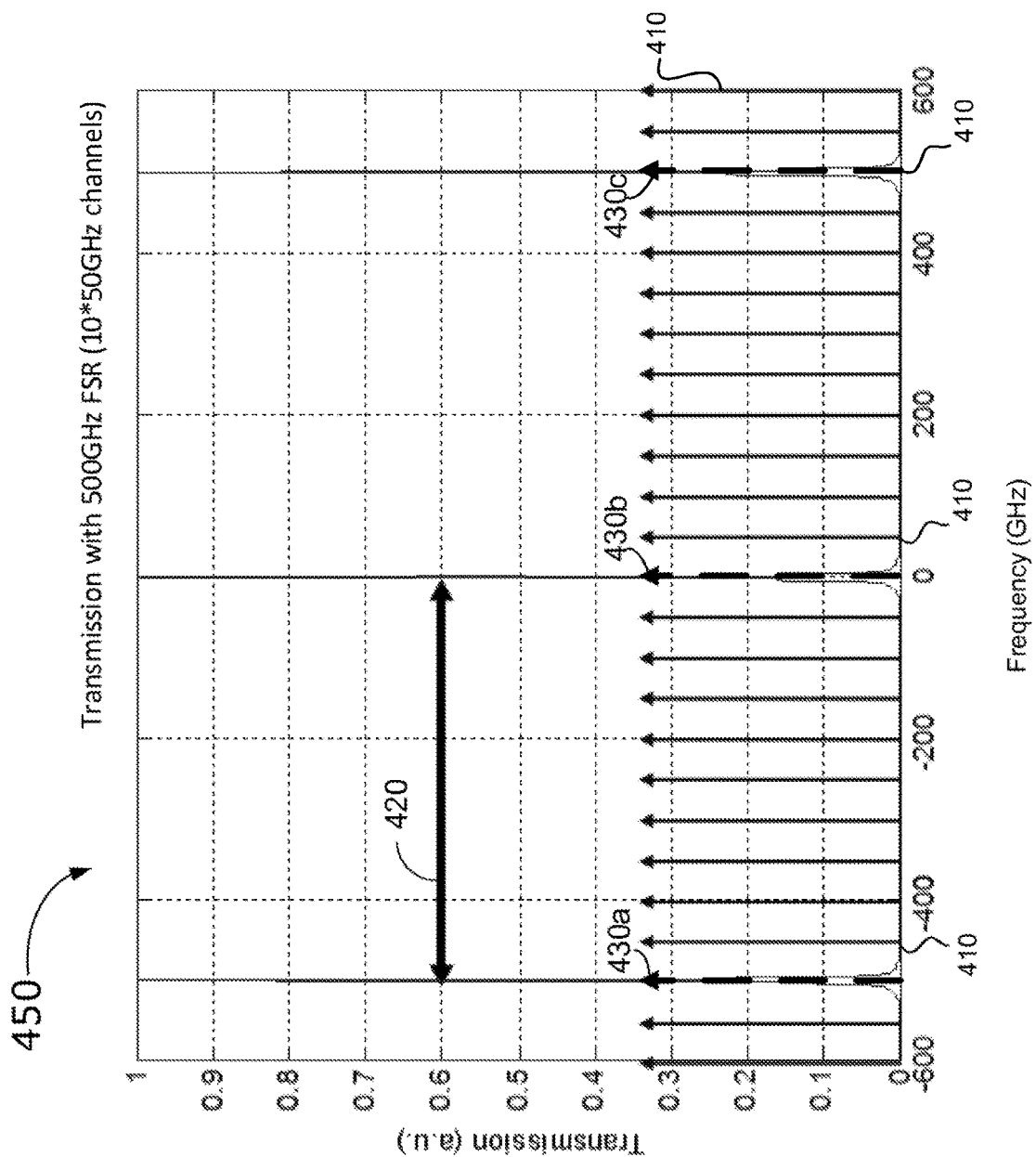
FIG. 4B illustrates an example transmission curve for a free spectrum range (FSR) of 500 GHz using the MRR in FIG. 4A.

FIG. 4B illustrates an example transmission curve 450 for a free spectrum range (FSR) 420 of 500 GHz (ten 50 GHz channels) using the MRR in FIG. 4A. The values on the x-axis should be read as the frequency offset from some optical frequency in the C band (e.g., 191~196 THz). 50 GHz spaced channels 410, which are represented by vertical arrows, are plotted along the x-axis. Due to the cyclic structure of the transmission curve, the wavelength signals 430a, 430b, 430c shown with spikes are all transmitted. Note that for ease of illustration and clarity, FIG. 4B only shows a small port of the entire frequency range.

FIGS. 5A, 5B, 6A, 6B, 7A, 7B, 8A and 8B each illustrates an example optical switch system for fast wavelength selection, in accordance with some example embodiments. All the example embodiments illustrated herein are configured to first separate a first set of multi-wavelength signals to groups in order to reduce the complexity of selecting one specific wavelength signal.

Figure 5A:
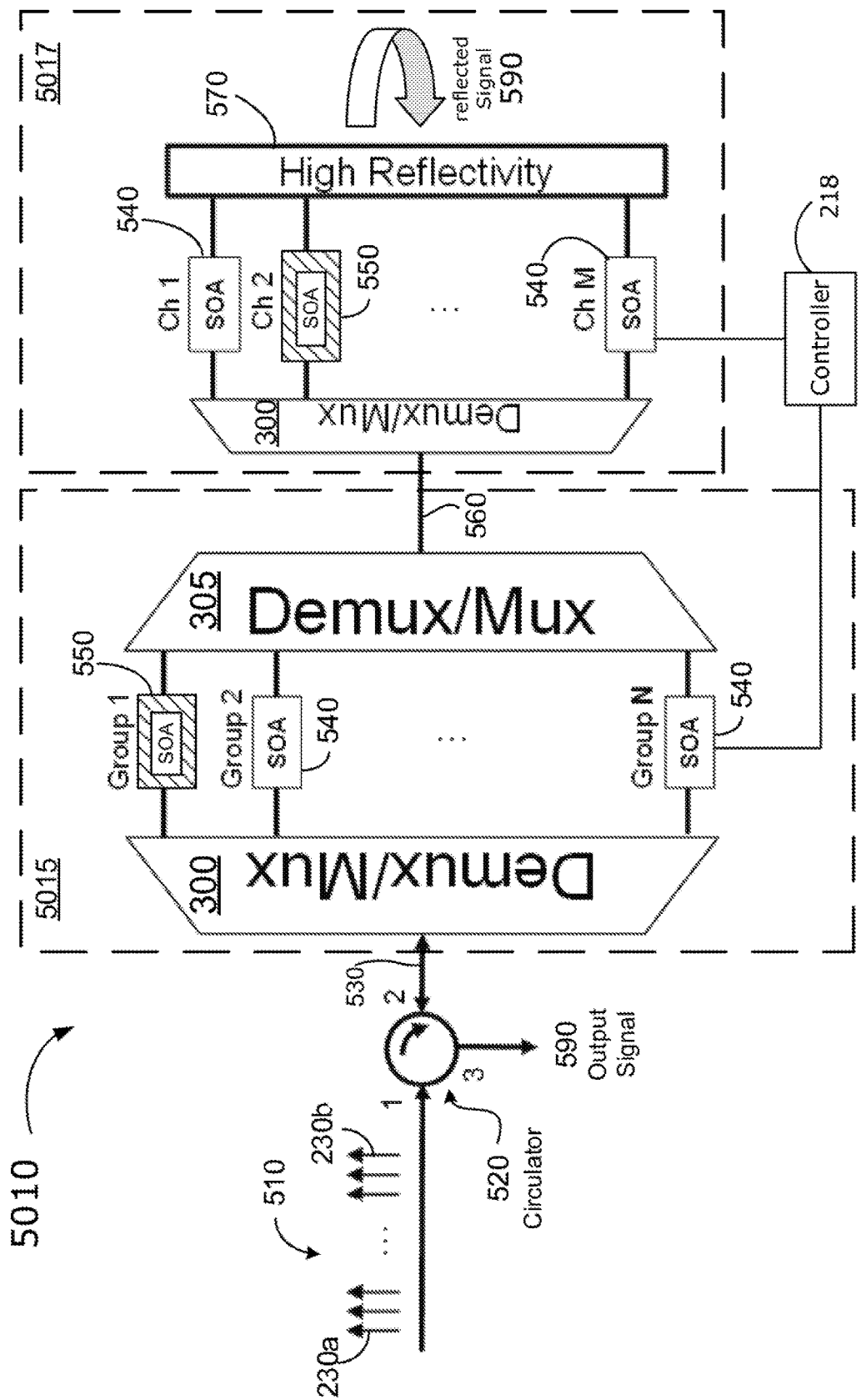
FIGS. 5A, 5B, 6A, 6B, 7A, 7B, 8A and 8B each illustrates an example optical switch system for fast wavelength selection, in accordance with some example embodiments.

FIG. 5A illustrates an example optical switch apparatus or system 5010 in which optical DEMUX/MUX devices 300, 305 are used to select a wavelength signal as an output, in accordance to example embodiments. The system 5010 includes an input port 530, one or more demultiplexer/multiplexer (DEMUX/MUX) devices 300, 305, one or more semiconductor optical amplifiers (SOAs) 540, 550, and an output selector device 570, which may be a high reflectivity device such as a reflector 570.

A first set of (multiplexed) multi-wavelength signals 510 including multiple wavelength signals 230a, 230b is received by an input port 1 of the circulator device 520, then transmitted via input port 2 of the circulator device 520 to the input port 530 of a first wavelength selector system 5015 for outputting a second set of (multiplexed) multi-wavelength signals 560. The first wavelength selector system 5015 may include a first DEMUX/MUX device which may be configured to be a first DEMUX device 300. The first DEMUX device 300 may be configured to separate the first set of multi-wavelength signals 510 into N groups of signals. As described above in relation to FIG. 3A, each DEMUX device 300 can separate a set of multi-wavelength signals into a plurality of groups of signals. In some embodiments, instead of a DEMUX device 300, a cyclic AWG device 350 may be used to separate the multi-wavelength signals into a plurality of groups of signals.

A controller such as the controller 218 may be connected with one or more optical components of any given optical network, but is, for ease of illustration, only explicitly illustrated in FIG. 5A for some of the optical components. It is to be appreciated that even when a controller is not shown in a particular schematic diagram of an optical network or optical switch system, some of the optical components of the network or system may still be connected to a controller.

Each of the N groups of signals is configured to route through a SOA 540, 550. Each SOA 540, 550 may be controlled by the controller 218. A SOA 540, 550 may be used as a fast blocker as a SOA may have a switching speed of 1 ns or less. Moreover, the amplification provided by the SOA can compensate for losses. For example, as illustrated in FIG. 5A, when the SOA 550 is turned on by a control signal, the signals of group 1 passes through the SOA 550. When a SOA 540 is not turned on, or is turned off, by the control signal, the respective group of signals routed through the SOA 540 is blocked by the SOA 540 and thus cannot pass through. By turning on only one particular SOA 550 among all the SOAs, a single group of signals is selected from the N groups of signals forming the first set of multi-wavelength signals 510. A SOA 540, 550 may take less than 1 nanosecond (ns) to be turned on or off, therefore the first wavelength selector system 5015 can take less than 1 ns to select a particular group of signals.

In some embodiments, throughout this disclosure, where an SOA 540, 550 is discussed, the SOA 540, 550 may be replaced by a different device configured to achieve fast selection of a wavelength channel among multiple wavelength channels, such as, for example, a Mach-Zehnder Interferometer (MZI) device, or an electrical absorption modulator.

In some embodiments, the selected group of signals (group 1 in the example illustrated in FIG. 5A) passing through SOA 550 may be transmitted to a second DEMUX/MUX device of the first wavelength selector system 5015, which may be configured to be a first MUX device 305. The first MUX device 305 may be connected to the first DEMUX device 300 via a plurality connections or paths, with at least one of the plurality of connections having a SOA 540, 550. For example, as shown in FIG. 5A, each of the plurality of connections has a SOA 540, 550 between the first DEMUX device 300 and the first MUX device 305.

The first MUX device 305 may multiplex the selected group of signals to be a second set of (multiplexed) multi-wavelength signals 560, which is a subset of the first set of multi-wavelength signals 510. The second set of multi-wavelength signals 560 may be processed by the second wavelength selector system 5017 for selecting a final output 590, which is an optical signal of a specific wavelength, as specified by the controller 218. The second wavelength selector system 5017 may include an input port for receiving the second set of multi-wavelength signals 560 from the first selector system 5015, a DEMUX/MUX device, one or more SOAs 540, 550 and the reflector device 570. The DEMUX/MUX device in the second wavelength selector system 5017 may be configured to be a second DEMUX device 300 to demultiplex the second set of multi-wavelength signals 560 into a plurality of optical signals, whereby each optical signal from the plurality of optical signals is routed through a SOA 540, 550. In this instance, the second DEMUX device 300 (which can also be a cyclic AWG device 350) has M output ports, and has a FSR of N channels.

Each optical signal, after being demultiplexed by the second DEMUX device 300, is configured to route through a SOA 540, 550. Each SOA 540, 550 is controlled by the controller 218. For example, as illustrated in FIG. 5A, when the SOA 550 is turned on by a control signal, the optical signal of wavelength channel 2 passes through the SOA 550. When a SOA 540 is not turned on, or is turned off, by the control signal, the respective optical signal routed through the SOA 540 is blocked by the SOA 540 and thus cannot pass through. By turning on only one particular SOA 550 among all the SOAs, an optical signal of a specific wavelength is selected from the M signals forming the second set of multi-wavelength signals 560. A SOA 540, 550 may take less than ins to be turned on or off, therefore the second wavelength selector system 5017 can take less than ins to select an output 590, which is an optical signal of a specific wavelength.

The selected optical signal of a specific wavelength, which is the output 590 of the second wavelength selector system 5017 may be reflected by the output selector device, e.g., reflector device 570. After reflection, the selected optical signal may pass through the original transmission route (e.g. through the SOA 550 of channel 2, the second DEMUX device 300, the first MUX device 305, the SOA 550 of group 1, and the first DEMUX device 300) and eventually exit out of port 3 of the circulator device 520 as the final output signal 590 of the system 5010.

This architecture shown in the optical switch system 5010 uses N+M SOAs 540, 550, which can be significantly less than the total number of wavelength signals (i.e., N×M signals) from the first set of multi-wavelength signals 510. As the switch time (e.g., the time it takes to turn on each SOA) of each SOA 540, 550 can be shorter than 1ns, and that the SOA in the first wavelength selector system 5015 and the SOA in the second wavelength selector system 5017 may be turned on by the controller 218 in parallel, the total time required to select an optical signal 590 of a specific wavelength from the first set of multi-wavelength signals 510 may be less than or around 1ns. In some embodiments, the FSR of the DEMUX device 300 in the second wavelength selector system 5017 needs to match the number of ports or groups in the MUX device 305 in the first wavelength selector system 5015.

Although the system 5010 as shown in FIG. 5A provides an example optical switch environment, this is only illustrative and is not intended to be limiting. In other examples, as illustrated below, the optical switch system may include other components, for example using a DEMUX/MUX device instead of the reflector device 570 to generate an output 590.

Figure 5B:
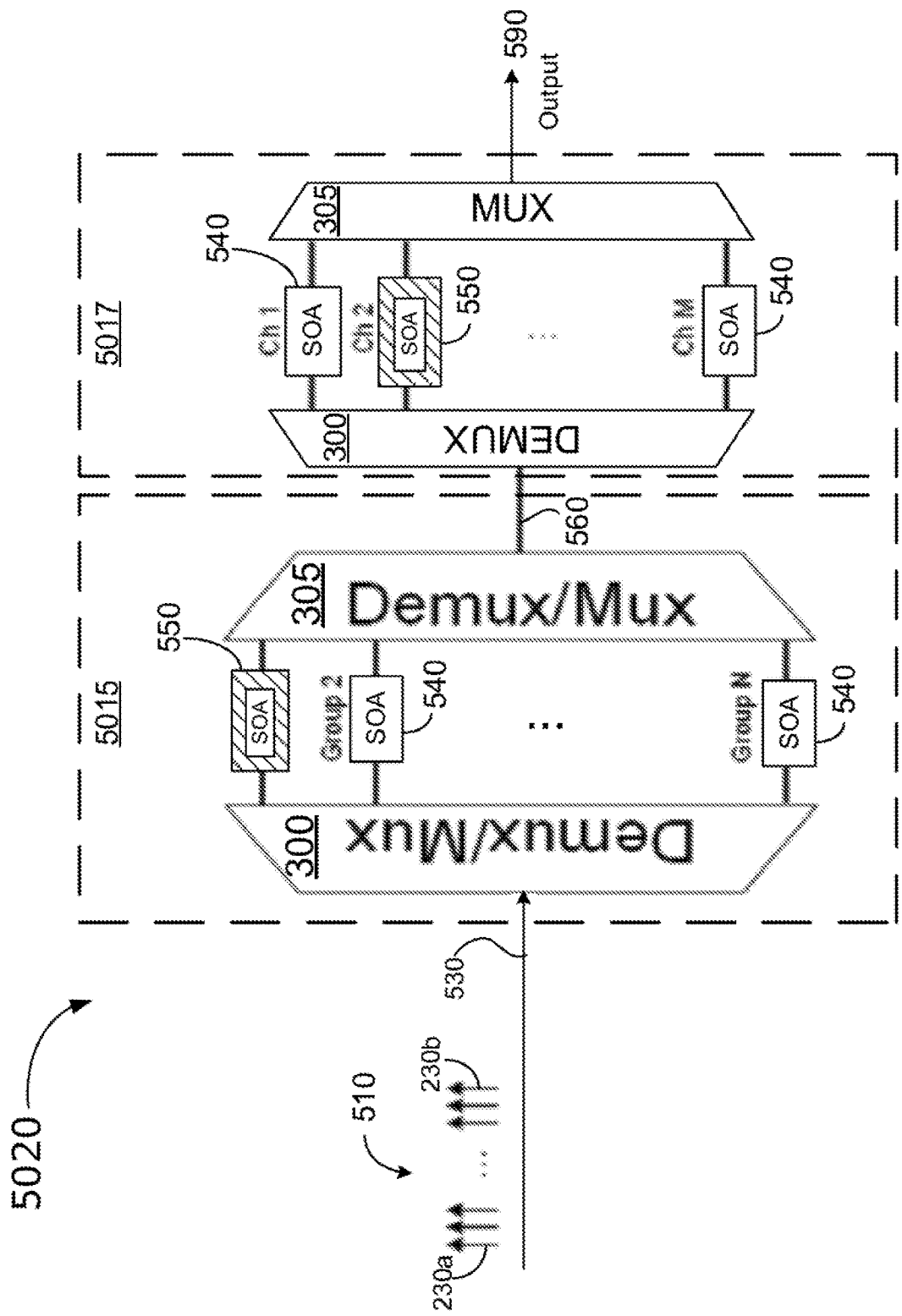

FIG. 5B shows an example optical switch system 5020 for selecting an optical signal 590 of a specific wavelength from a first set of multi-wavelength signals 510. The optical switch system 5020 includes a first wavelength selector system 5015 and a second wavelength selector system 5017. The first wavelength selector system 5015 is similar to the one described above in relation to FIG. 5A, and the second wavelength selector system 5017 uses a DEMUX/MUX device, which is configured to be a MUX device 305 in this instance, to generate the final output 590, instead of using a reflector device 570. For example, once an optical signal (e.g. from wavelength channel 2) is selected by the SOA 550 in the second wavelength selector system 5017, the optical signal passes through the DEMUX device 300 as the final output 590.

Figure 6A:
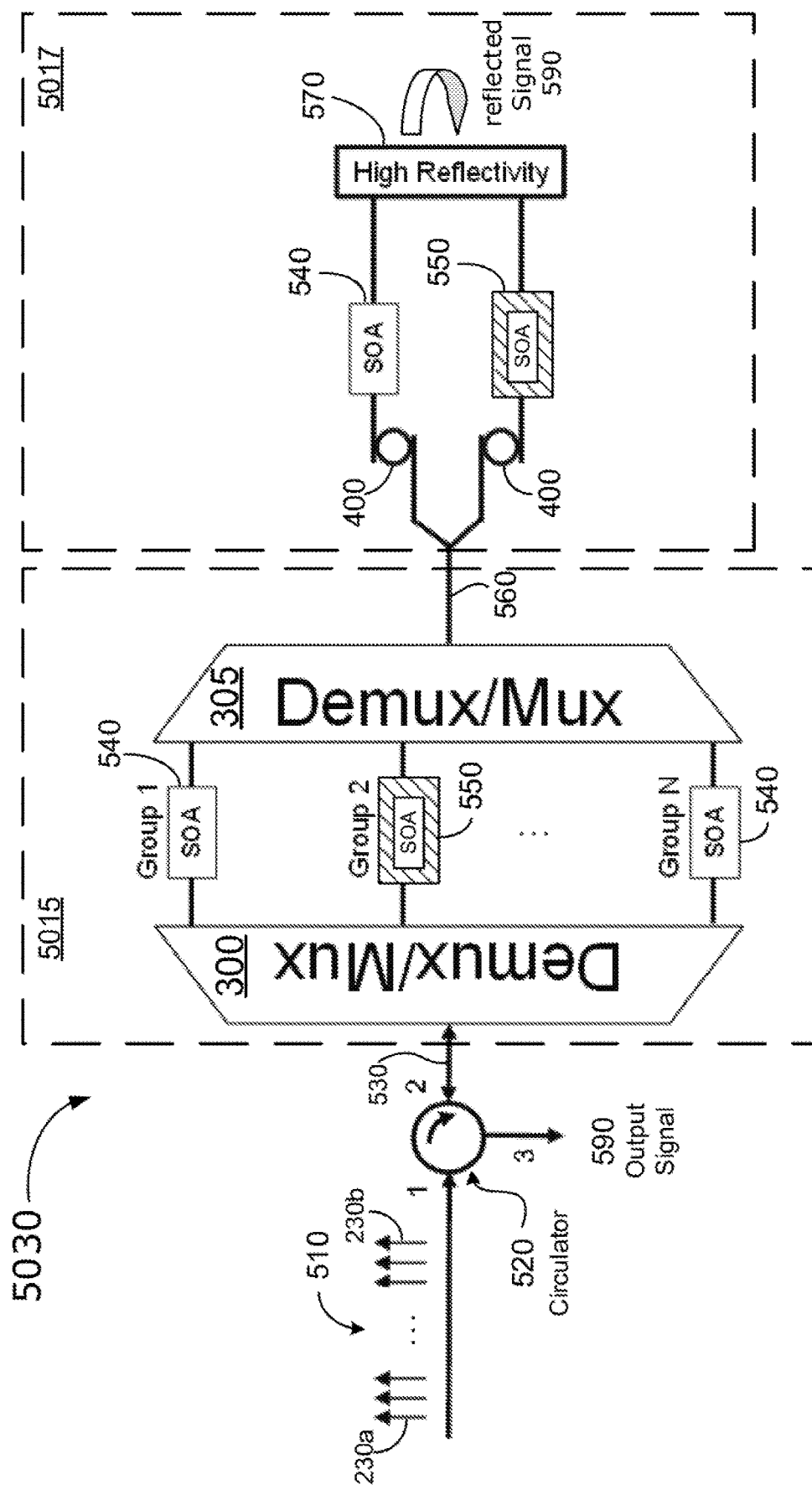

FIG. 6A illustrates another example optical switch system 5030 for selecting an optical signal 590 of a specific wavelength from the first set of multi-wavelength signals 510, which may include multiple wavelength signals 230a, 230b. The first set of multi-wavelength signals 510 is received by an input port 1 of the circulator device 520, then transmitted via input port 2 of the circulator device 520 to the input port 530 of a first wavelength selector system 5015 for outputting a second set of (multiplexed) multi-wavelength signals 560. The first wavelength selector system 5015 may include a first DEMUX/MUX device, which may be configured to be a first DEMUX device 300. The first DEMUX device 300 may be configured to separate the first set of multi-wavelength signals 510 into N groups of signals. As described above in relation to FIG. 3A, each DEMUX device 300 can separate a set of multi-wavelength signals into a plurality of groups of signals. In some embodiments, instead of a DEMUX device 300, a cyclic AWG device 350 may be used to separate the multi-wavelength signals into a plurality of groups of signals.

Each of the N groups of signals is configured to route through a SOA 540, 550. Each SOA 540, 550 may be controlled by the controller (not shown). A SOA 540, 550 may be used a fast blocker as a SOA may have a switching speed of 1 ns or less. Moreover, the amplification provided by the SOA 550 can compensate for losses. For example, as illustrated in FIG. 6A, when the SOA 550 is turned on by a control signal, the signals of group 2 passes through the SOA 550. When a SOA 540 is not turned on, or is turned off, by the control signal, the respective group of signals routed through the SOA 540 is blocked by the SOA 540 and thus cannot pass through. By turning on only one particular SOA 550 among all the SOAs, a single group of signals is selected from the N groups of signals forming the first set of multi-wavelength signals 510. A SOA 540, 550 may take less than 1 ns to be turned on or off, therefore the first wavelength selector system 5015 can take less than 1 ns to select a particular group of signals.

In some embodiments, the selected group of signals (group 2 in the example illustrated in FIG. 6A) passing through SOA 550 may be transmitted to a second DEMUX/MUX device of the first wavelength selector system 5015, which may be configured to be a first MUX device 305. The first MUX device 305 may multiplex the selected group of signals to be a second set of (multiplexed) multi-wavelength signals 560, which is a subset of the first set of multi-wavelength signals 510. The second set of multi-wavelength signals 560 may be processed by the second wavelength selector system 5017 for selecting the optical signal 590 of a specific wavelength, as specified by the controller (not shown). The second wavelength selector system 5017 may include an input port for receiving the second set of multi-wavelength signals 560 from the first selector system 5015, two MRRs 400, two SOAs 540, 550, and an output selector device 570, which can be a high reflectivity device 570 or a reflector device 570.

In some example embodiments, instead of a DEMUX/MUX device or a cyclic AWG device, MRRs 400 are used to select a particular wavelength channel from the second set of multi-wavelength signals 560. As only a small tuning range is needed to select a specific wavelength channel from a relatively small group of multi-wavelength signals (e.g., around or less than 10 to 15 channels), carrier injection may be used to operate the MRRs 400, which means that the MRRs 400 may have a faster switching speed using carrier injection than using thermal tuning. A tuning time of less than 20 ns may be achievable by using carrier injection.

When a MRR 400 is used to select a specific wavelength channel from a group of multi-wavelength channels, a SOA 540, 500 may be optional. However, a SOA may, through amplification, help compensate for any losses which may have been incurred by the DEMUX/MUX device(s) 300, 305 or the MRR 400.

Throughout this disclosure, selecting an optical signal of a specific wavelength is also referred to as selecting a (specific) wavelength channel. To further decrease the time required to select a specific wavelength channel, a two-path architecture may be implemented as shown in the second wavelength selector system 5017 in FIG. 6A, where the second set of multi-wavelength signals 560 is passed to two optical network paths, with each optical network path having a respective MRR 400 and a respective SOA 540, 550. While one path is in operation to select a specific wavelength channel, the other path may be tuning towards the next specific wavelength channel. By using this ping-pong structure, the switching time is only limited by the SOA switching time, which may be less than 1ns.

When the SOA 550 is turned on by a control signal, the optical signal routed through the SOA 5500 simply passes through the SOA 550. When the SOA 540 is not turned on, or is turned off, the optical signal routed through the SOA 540 is blocked by the SOA 540 and thus cannot pass through. By turning on only one particular SOA 550 among the two SOAs, an optical signal of a specific wavelength is selected from the signals forming the second set of multi-wavelength signals 560. The second wavelength selector system 5017 can take less than ins to select an optical signal 590 of a specific wavelength.

The output 590 of the second wavelength selector system 5017 may be reflected by the output selector device, e.g., reflector device 570. After reflection, the selected optical signal may pass through the original transmission route (e.g. through the SOA 550, the MRR 400, the first MUX device 305, the SOA 550 of group 2, and the first DEMUX device 300) and eventually exit out of port 3 of the circulator device 520 as the final output signal 590 of the system 5030.

In some embodiments, the SOA 540, 550 in the second wavelength selector system 5017 may be placed before the MRRs 400, without affecting the total switch time of the system 5017.

Figure 6B:
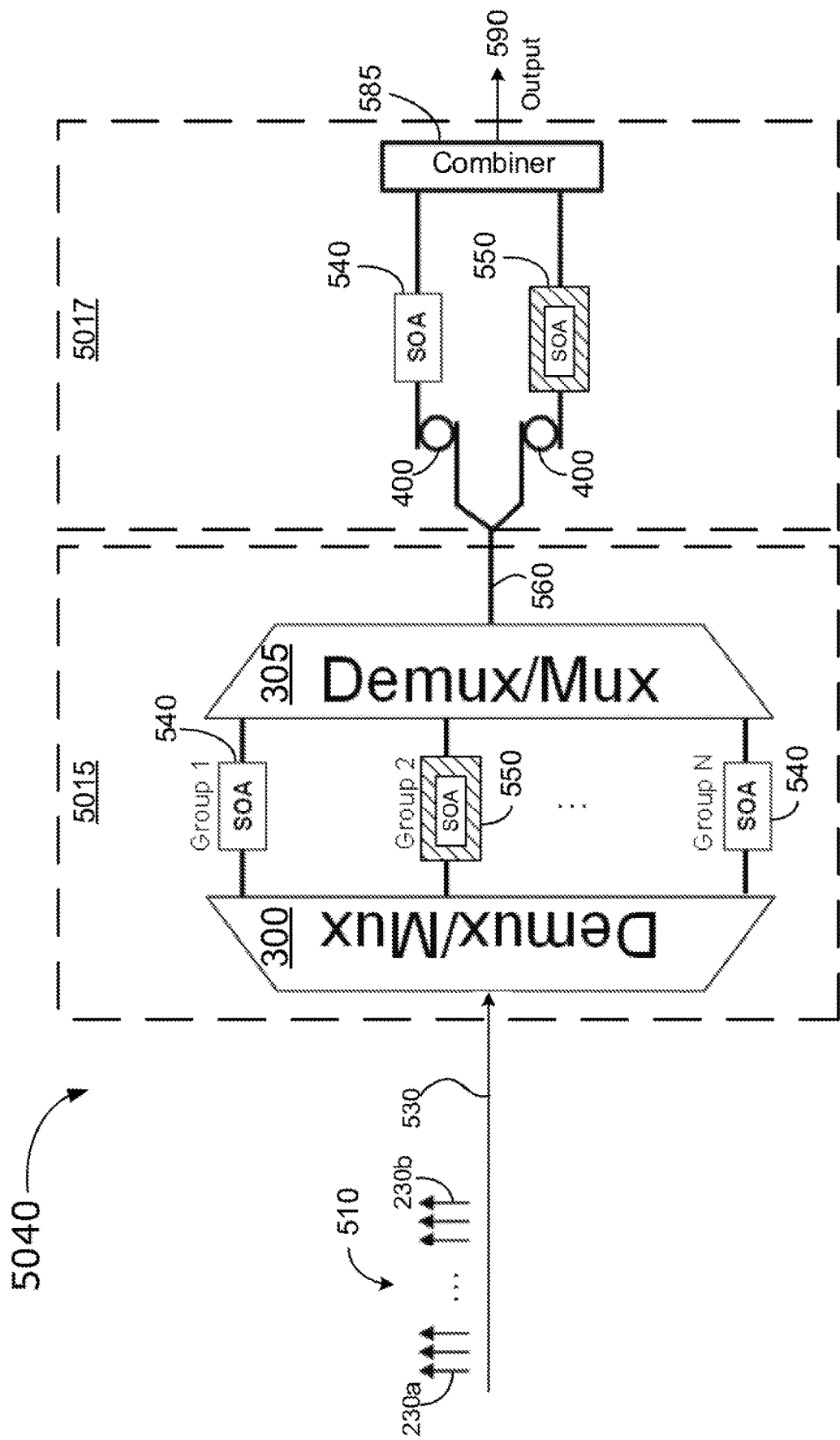

FIG. 6B shows an example optical switch system 5040 for selecting an optical signal 590 of a specific wavelength from a first set of multi-wavelength signals 510. The optical switch system 5040 includes a first wavelength selector system 5015 and a second wavelength selector system 5017. The first wavelength selector system 5015 is similar to the one described above in relation to FIGS. 5A and 6A, and the second wavelength selector system 5017 uses a combiner device 585, which may be a MUX device 305, to generate the final output 590, instead of using a reflector device 570. For example, once an optical signal is selected by the SOA 550 in the second wavelength selector system 5017, the optical signal passes through the combiner device 585 as the final output 590.

Figure 7A:
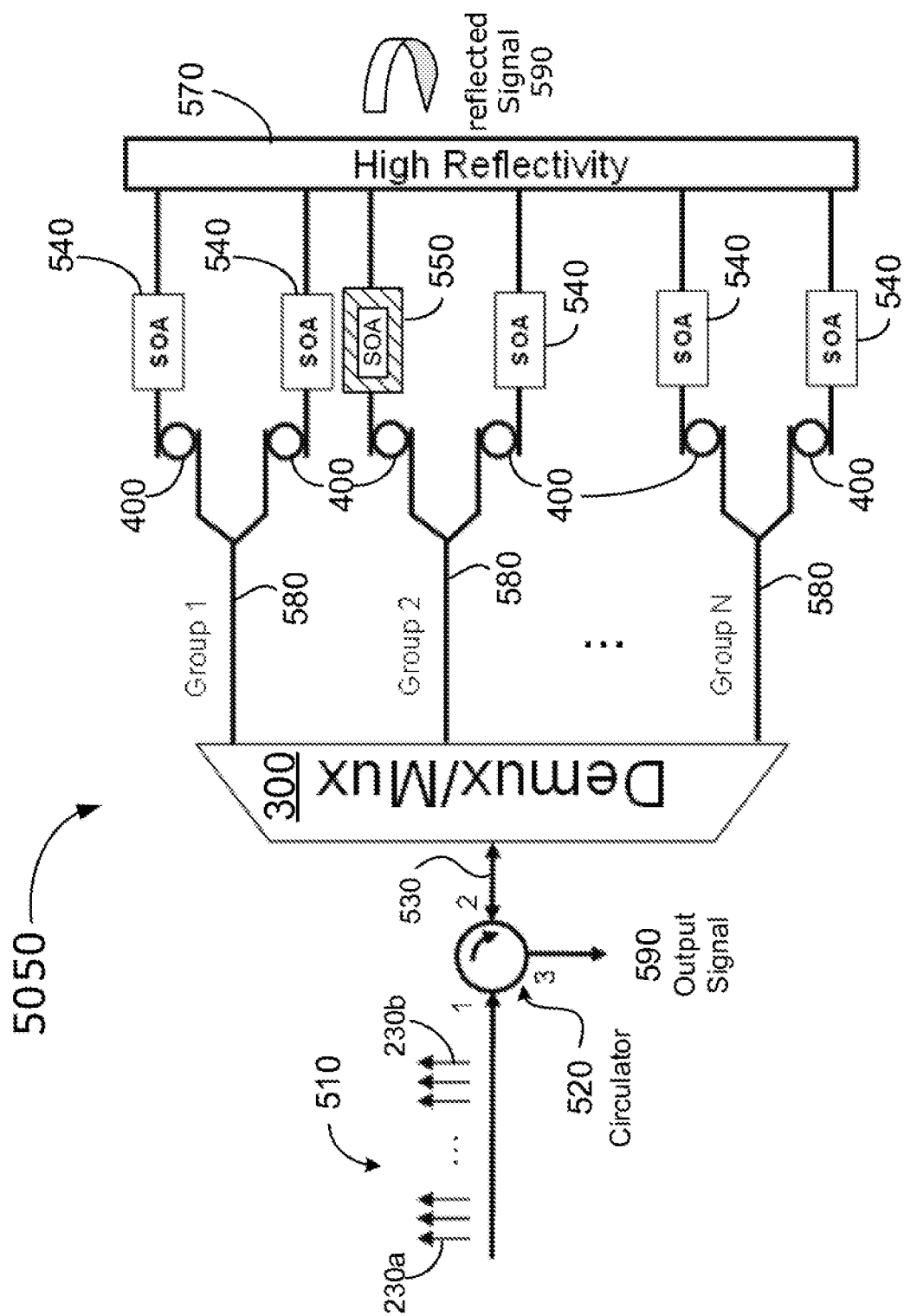

FIG. 7A illustrates yet another optical switch system 5050 for selecting an optical signal 590 of a specific wavelength from the first set of multi-wavelength signals 510, which may include multiple wavelength signals 230a, 230b. The first set of multi-wavelength signals 510 is received by an input port 1 of the circulator device 520, then transmitted via input port 2 of the circulator device 520 to the input port 530 of a first DEMUX/MUX device, which may be configured to be a first DEMUX device 300. The first DEMUX device 300 may be configured to separate the first set of multi-wavelength signals 510 into N groups of signals (i.e., group 1 to N). In some embodiments, instead of a DEMUX device 300, a cyclic AWG device 350 may be used to separate the multi-wavelength signals into a plurality of groups of signals.

Each group 580 from the N groups of signals may be then configured to route through a respective MRR 400 and a respective SOA 540, 550. A MRR 400 may be controlled by a controller (not shown) to select a particular wavelength channel from a given group 580 of multi-wavelength signals. As only a small tuning range is needed to select a specific wavelength channel from a relatively small group of multi-wavelength signals, carrier injection may be used to operate the MRR 400, which means that the MRR 400 may have a faster switching speed using carrier injection than using thermal tuning. A tuning time of less than 20 ns may be achievable by using carrier injection.

Each SOA 540, 550 may be controlled by the controller. For example, when the SOA 550 is turned on by a control signal, an optical signal routed through the SOA 550 is passed onto the high reflectivity device 570, assuming that the MRR 400 preceding the SOA 500 has been tuned to select the particular optical signal of a specific wavelength. When a SOA 540 is not turned on, or is turned off, by the control signal, the respective signal routed through the SOA 540 is blocked by the SOA 540 and thus cannot pass through.

When a MRR 400 is used to select a specific wavelength channel from a group of multi-wavelength channels, a SOA 540, 500 may be optional. However, a SOA 550 may, through amplification, help compensate for any losses which may have been incurred by the DEMUX/MUX device or the MRR 400.

In the optical switch system 5040 illustrated in FIG. 7A, the first set of multi-wavelength signals 510 are divided first by the DEMUX device 300 into a plurality of groups 580, with each group 580 of signals passing through two optical network paths, with each optical network path including a respective MRR 400 and a respective SOA 540, 550. The two-path architecture may be implemented to further decrease the time required to select a specific wavelength channel. For example, when one path is in operation to select a specific wavelength channel, the other path may be tuning towards the next specific wavelength channel. By using this ping-pong structure, the switching time is only limited by the SOA switching time, which may be less than 1 ns. In some embodiments, the SOA 540, 550 may be placed before a respective MRR 400.

The output 590 selected by a particular MRR 400 and a SOA 550 may be reflected by the output selector device, e.g., reflector device 570. After reflection, the selected optical signal may pass through the original transmission route and eventually exit out of port 3 of the circulator device 520 as the final output signal 590 of the system 5050.

Figure 7B:
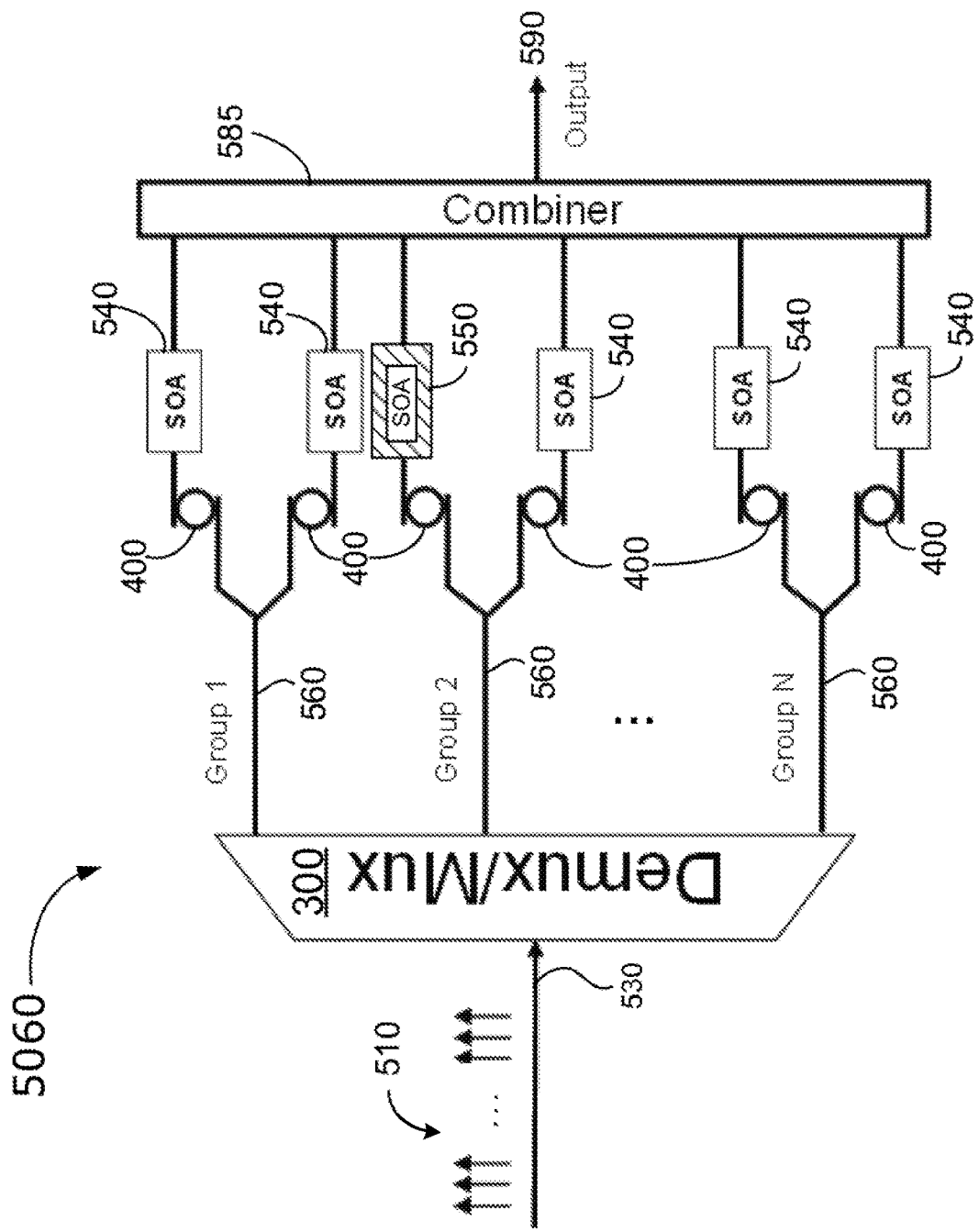

FIG. 7B shows an example optical switch system 5060 for selecting an optical signal 590 of a specific wavelength from a first set of multi-wavelength signals 510. The optical switch system 5060 includes a DEMUX/MUX device similar to the one described above in relation to FIG. 7A, a plurality of MRRs 400 and SOAs 540, 550 similar to the components described above in relation to FIG. 7A, and a combiner device 585 (instead of a reflector device 570), which may be a MUX device 305, to generate the final output 590. For example, once an optical signal is selected by the MRR 400 and the SOA 550, the optical signal passes through the combiner device 585 as the final output 590 of the system 5060.

Figure 8A:
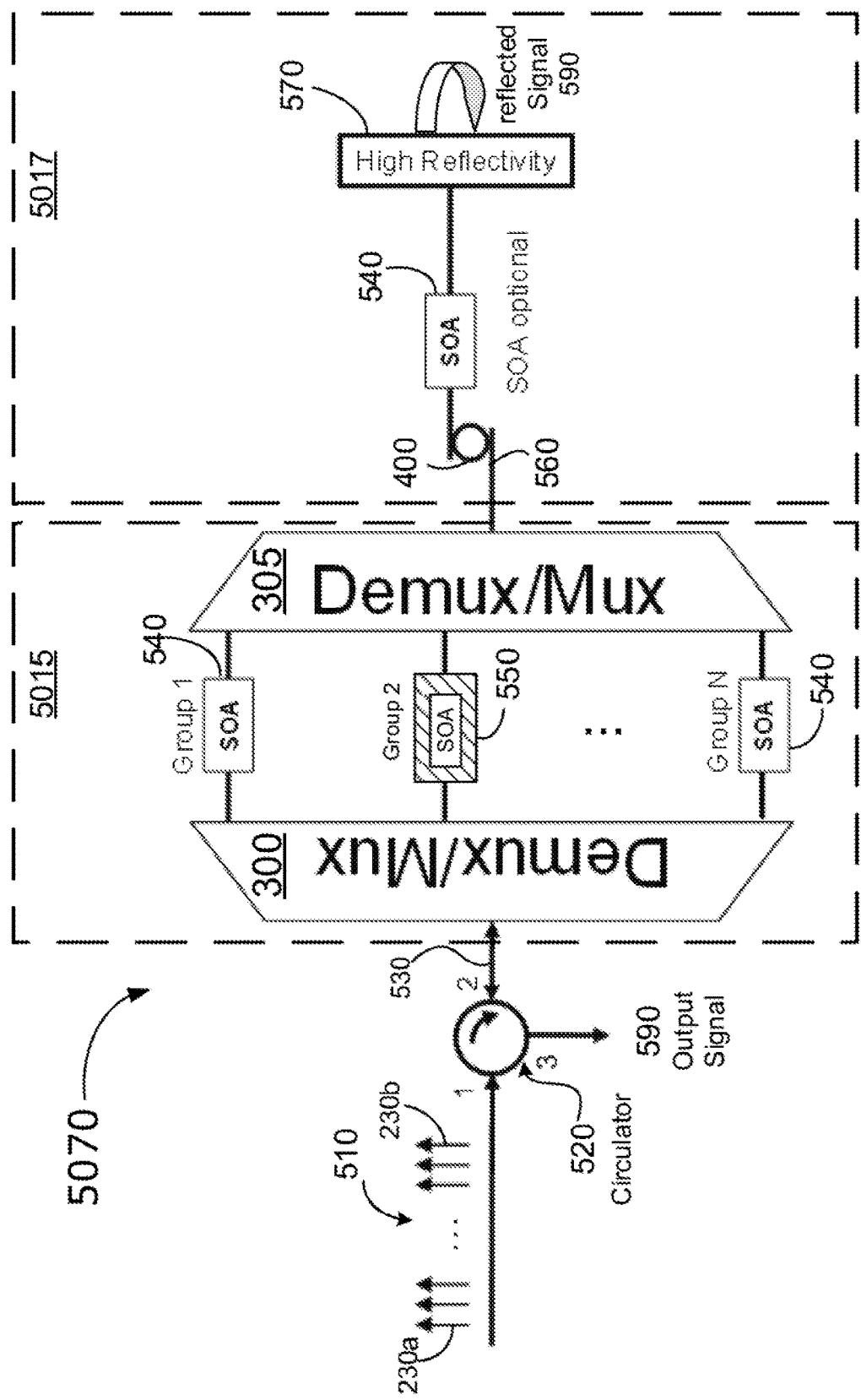

FIG. 8A illustrates another optical switch system 5070 for selecting an optical signal 590 of a specific wavelength from the first set of multi-wavelength signals 510, which may include multiple wavelength signals 230a, 230b. The first set of multi-wavelength signals 510 is received by an input port 1 of the circulator device 520, then transmitted via input port 2 of the circulator device 520 to the input port 530 of a first wavelength selector system 5015 for outputting a second set of (multiplexed) multi-wavelength signals 560. The first wavelength selector system 5015 may include a first DEMUX/MUX device, which may be configured to be a first DEMUX device 300. The first DEMUX device 300 may be configured to separate the first set of multi-wavelength signals 510 into N groups of signals. In some embodiments, instead of a DEMUX device 300, a cyclic AWG device 350 may be used to separate the multi-wavelength signals into a plurality of groups of signals.

Each group of the N groups of signals may be configured to route through a SOA 540, 550. Each SOA 540, 550 may be controlled by the controller (not shown). A SOA 540, 550 may be used a fast blocker as a SOA may have a switching speed of 1 ns or less. Moreover, the amplification provided by the SOA 550 can compensate for losses. For example, as illustrated in FIG. 8A, when the SOA 550 is turned on by a control signal, the signals of group 2 passes through the SOA 550. When a SOA 540 is not turned on, or is turned off, by the control signal, the respective group of signals routed through the SOA 540 is blocked by the SOA 540 and thus cannot pass through. By turning on only one particular SOA 550 among all the SOAs, a single group of signals (e.g., group 2) is selected from the N groups of signals forming the first set of multi-wavelength signals 510.

In some embodiments, the selected group of signals passing through SOA 550 may be transmitted to a second DEMUX/MUX device, which may be configured to be a first MUX device 305. The first MUX device 305 may multiplex the selected group of signals to be a second set of (multiplexed) multi-wavelength signals 560, which is a subset of the first set of multi-wavelength signals 510. The second set of multi-wavelength signals 560 may then be processed by a second wavelength selector system 5017 including a MRR 400, a SOA 540, and an output selector device 570, which can be a high reflectivity device 570 or a reflector device 570.

The MRR 400 may be used to select a particular wavelength channel from the second set of multi-wavelength signals 560. As only a small tuning range is needed to select a specific wavelength channel from a relatively small group of multi-wavelength signals, carrier injection may be used to operate the MRR 400, which means that the MRR 400 may have a faster switching speed using carrier injection than using thermal tuning. A tuning time of less than 20 ns may be achievable by using carrier injection.

When a MRR 400 is used to select a specific wavelength channel from a group of multi-wavelength channels, a SOA 540 may be optional. However, a SOA may, through amplification, help compensate for any losses which may have been incurred by the DEMUX/MUX devices 300, 305 or the MRR 400.

When the SOA 540 is turned on by a control signal, the optical signal routed through the SOA 5500 simply passes through the SOA 540. When the SOA 540 is not turned on, or is turned off, the optical signal routed through the SOA 540 is blocked by the SOA 540 and thus cannot pass through.

The output 590 selected by the MRR 400 and the optional SOA 540 may be reflected by the output selector device, e.g., reflector device 570. After reflection, the selected optical signal may pass through the original transmission route and eventually exit out of port 3 of the circulator device 520 as the final output signal 590 of the system 5070.

In some embodiments, the SOA 540 may be placed before the MRR 400, without affecting the total switch time of the system 5070.

Figure 8B:
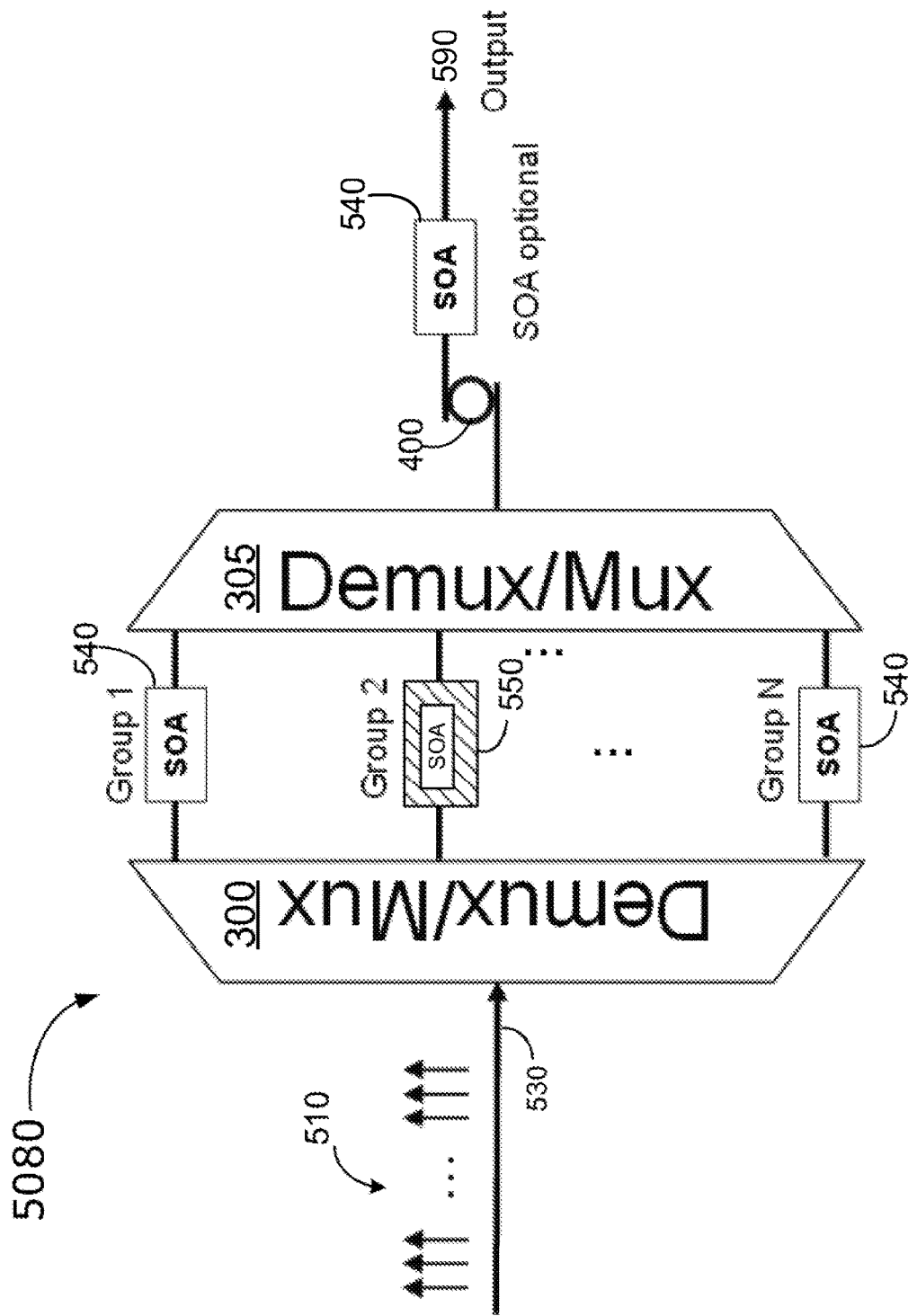

FIG. 8B shows an example optical switch system 5080 for selecting an optical signal 590 of a specific wavelength from a first set of multi-wavelength signals 510. The optical switch system 5080 includes two DEMUX/MUX devices 300, a MRR 400, a plurality of SOAs 540, 550 similar to the one described above in relation to FIG. 8A, and a combiner device 585 (instead of using a reflector device 570), which may be a MUX device 305, to generate the final output 590. For example, once an optical signal is selected by the MRR 400 and the SOA 540, the optical signal passes through the combiner device 585 as the final output 590 of the system 5080.

Figure 9:
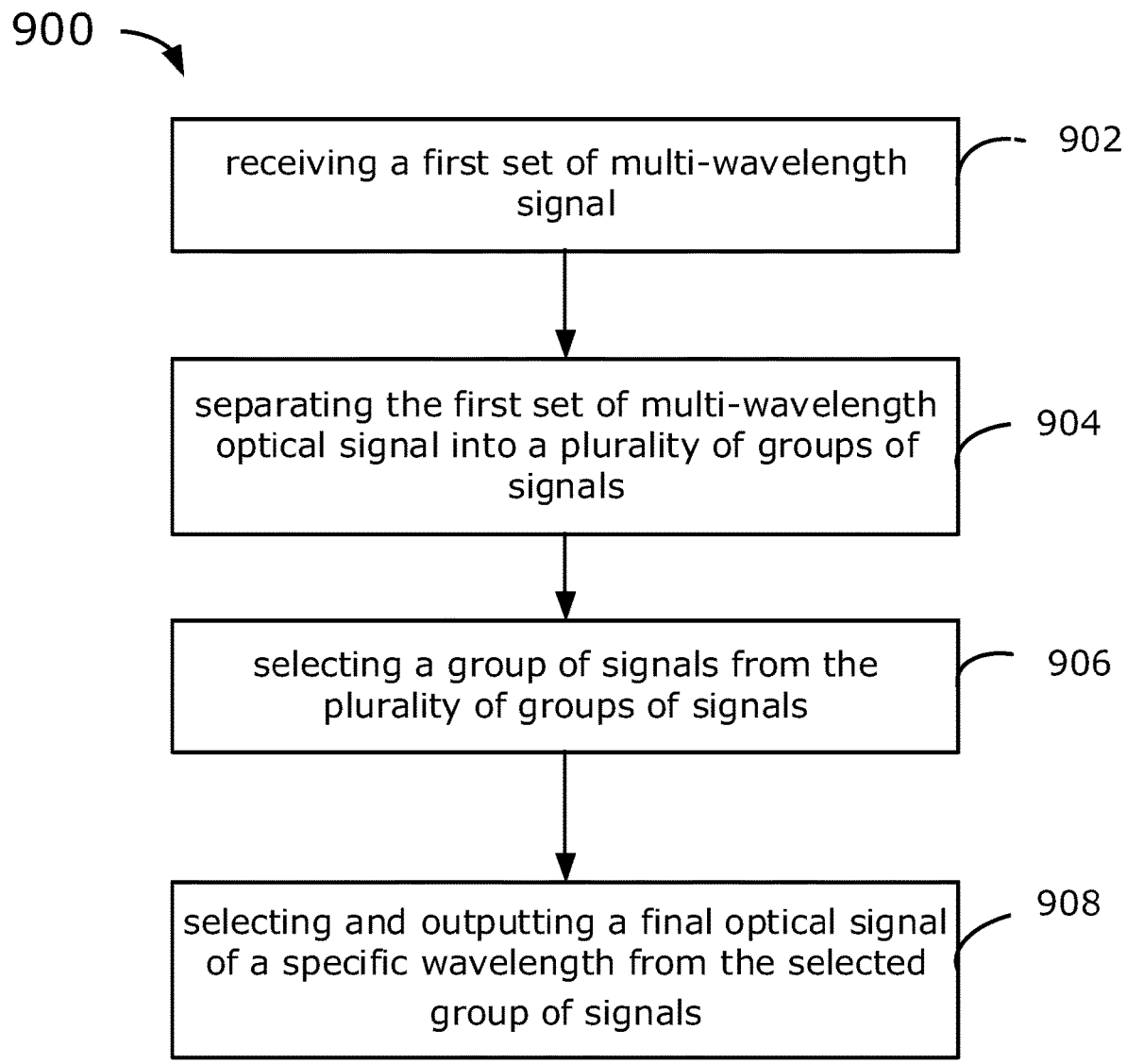
FIG. 9 is a flow chart illustrating an example method which may be carried out by one or more optical switch systems illustrated in FIG. 5A to FIG. 8B, in accordance with some example embodiments.

FIG. 9 is a flow chart illustrating an example method 900 which may be carried out by any optical switch systems illustrated in each of FIG. 5A to FIG. 8B, in accordance with some example embodiments. At step 902, an optical switch system (the "system") may receive a first set of multi-wavelength signals 510. For example, the first set of multi-wavelength signals 510 may be received by a first optical DEMUX device 300 or a cyclic AWG device 350.

At step 904, the system may separate the first set of multi-wavelength signals 510 into a plurality of groups of signals by the first optical DEMUX device 300 or the cyclic AWG device 350.

At step 906, the system may select a group of signals from the plurality of groups of signals. For example, the selection may be performed by a SOA 540, 550 that uses thermal tuning or carrier injection. A SOA using carrier injection may achieve a tuning speed of 20 ns or less while providing some amplification to compensate for losses that may have been incurred previously by the DEMUX device 300 or the cyclic AWG device 350.

In some embodiments, the selected group of signals may be multiplexed into a second subset of multi-wavelength signals 560, for example by using a first MUX device 305, as shown in FIGS. 5A, 5B, 6A, 6B, 8A and 8B.

At step 908, the system may select and output a final optical signal of a specific wavelength from the selected group of signals or the second subset of multi-wavelength signals 560. For example, the system may select and output the final optical signal from the selected group of signals by using a wavelength selector system.

In some embodiments, the wavelength selector system may include a second optical DEMUX device 300, a SOA 540, 550 and an output selector device 570, and the step 908 may include sub-steps of: receiving the selected group of signals by a second optical DEMUX device 300 coupled to the first optical MUX device 305; selecting the final optical signal of the specific wavelength by the SOA 550 coupled to the second optical DEMUX device 300; and outputting the final optical signal by the output selector device 570 coupled to the second optical DEMUX device 300.

In some embodiments, the wavelength selector system may include two tunable MRRs 400 and an output selector device 570, and the step 908 may include sub-steps of: receiving the selected group of signals by the two tunable MRRs 400 coupled to the first optical MUX device 305; selecting the final optical signal of the specific wavelength by the two tunable MRRs 400; and outputting the final optical signal by the output selector device 570 coupled to the two tunable MRRs.

In some embodiments, the wavelength selector system may include two SOAs 540, 550, with each SOA 540, 550 coupled to a respective tunable MRR 400, and the method 900 may further include providing a power gain by the SOA 550 that has been turned on to amplify the selected signal.

Figure 10:
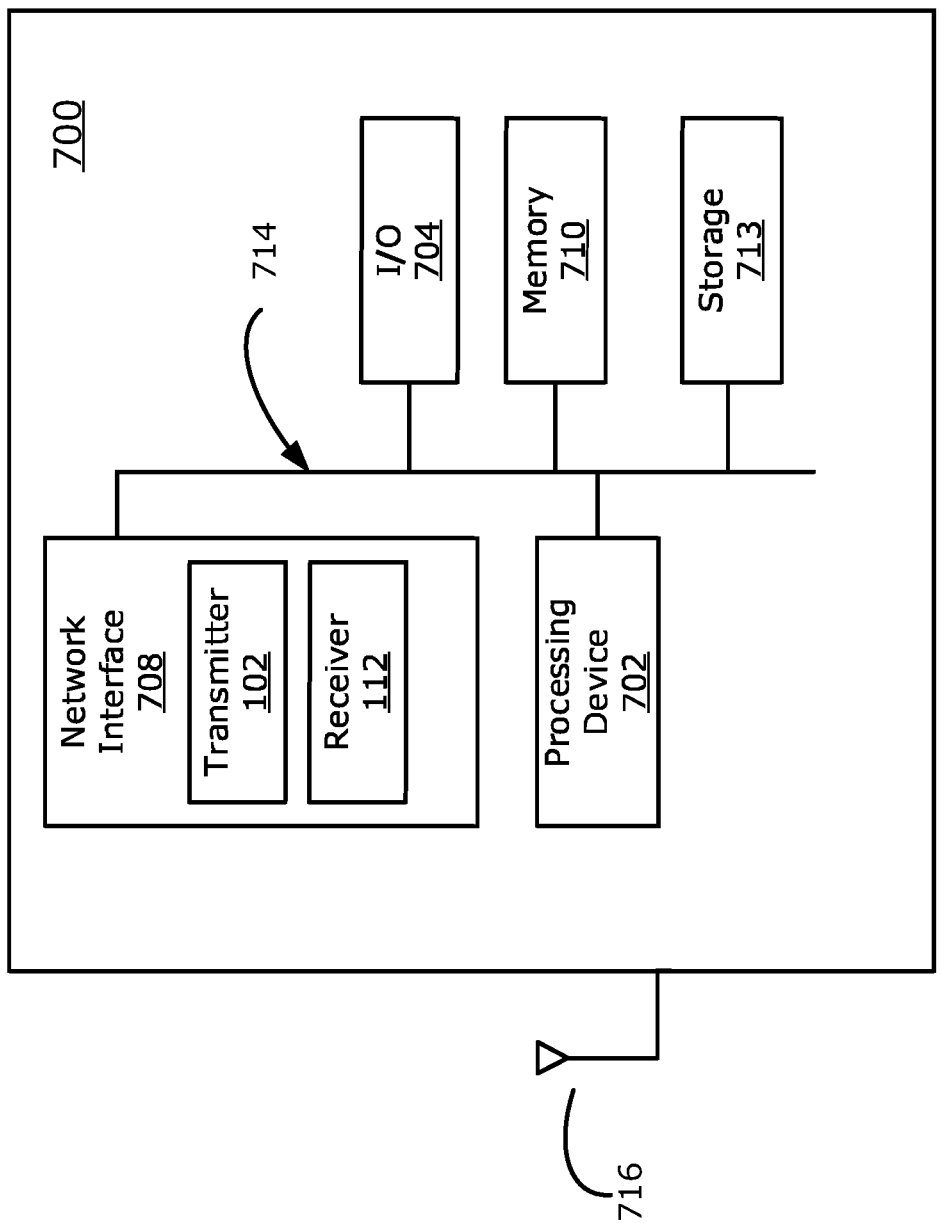
FIG. 10 is a schematic diagram of an example controller device, in accordance with some example embodiments.

FIG. 10 illustrates an example processing system 700 which may be used to implement methods and systems described herein, such as the example controller 218. Other processing systems suitable for implementing the methods and systems described in the present disclosure may be used, which may include components different from those discussed below. Although FIG. 10 shows a single instance of each component, there may be multiple instances of each component in the processing system 700.

The processing system 700 may include one or more processing devices 702, such as a processor, a microprocessor, an application-specific integrated circuit (ASIC), a field-programmable gate array (FPGA), a dedicated logic circuitry, or combinations thereof. The processing system 700 may also include one or more input/output (I/O) interfaces 714, which may enable interfacing with one or more appropriate input devices and/or output devices (not shown). One or more of the input devices and/or output devices may be included as a component of the processing system 700 or may be external to the processing system 700. The processing system 700 may include one or more network interfaces 708 for wired or wireless communication with a network. In example embodiments, network interfaces 708 include one or more wireless interfaces such as transmitters 102 and receivers 112 that enable communications in a network. The network interface(s) 708 may include interfaces for wired links (e.g., Ethernet cable) and/or wireless links (e.g., one or more radio frequency links) for intra-network and/or inter-network communications. In this example, a single antenna 716 is shown, which may serve as both transmitting and receiving antenna. However, in other examples there may be separate antennas for transmitting and receiving.

The processing system 700 may also include one or more storage units 713, which may include a mass storage unit such as a solid state drive, a hard disk drive, a magnetic disk drive and/or an optical disk drive. The processing system 700 may include one or more memories 710, which may include a volatile or non-volatile memory (e.g., a flash memory, a random access memory (RAM), and/or a read-only memory (ROM)). The non-transitory memory(ies) 710 may store instructions for execution by the processing device(s) 702, such as to carry out the present disclosure. The memory(ies) 710 may include other software instructions, such as for implementing an operating system and other applications/functions. In some examples, one or more data sets and/or module(s) may be provided by an external memory (e.g., an external drive in wired or wireless communication with the processing system 700) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 714 providing communication among components of the processing system 700, including the processing device(s) 702, I/O interface(s) 704, network interface(s) 708, storage unit(s) 713, memory(ies) 710. The bus 714 may be any suitable bus architecture including, for example, a memory bus, a peripheral bus or a video bus.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., an onboard processor, a personal computer, a server, or a network device) to execute examples of the methods disclosed herein.

Certain adaptations and modifications of the described embodiments can be made. Therefore, the above discussed embodiments are considered to be illustrative and not restrictive. Although this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A system in an optical network, comprising:
a first wavelength selector system having a first input port and a first output port, the first input port configured to receive a first set of multi-wavelength signals and the first output port configured to output a second set of multi-wavelength signals, the second set of multi-wavelength signals being a subset of the first set of multi-wavelength signals, the subset of the first set of multi-wavelength signals being grouped depending on a wavelength channel;
a second wavelength selector system having a second input port and a second output port, the second input port configured to receive the second set of multi-wavelength signals, and the second output port configured to output a final optical signal of a specific wavelength from the second set of multi-wavelength signals; and
a controller coupled to the first wavelength selector system and the second wavelength selector system, wherein the controller is configured to control one or more switches in each wavelength selector system to select at least one of the second set of multi-wavelength signals and the final optical signal.

2. The system of claim 1, wherein the first wavelength selector system comprises:
a first optical demultiplexer (DEMUX) device configured to receive and separate the first set of multi-wavelength signals into a plurality of groups of signals; and
a first optical multiplexer (MUX) device configured to: receive the plurality of groups of signals via a first plurality of connections from the first optical DEMUX device, each group of signals being transmitted via a respective connection from the first plurality of connections; and output the second set of multi-wavelength signals comprising a single group of signals from the plurality of groups of signals.

3. The system of claim 2, wherein the first wavelength selector system comprises:
a semiconductor optical amplifier (SOA) as part of a connection from the first plurality of connections, wherein when the SOA is turned on by the controller, a respective group of signals passes through the SOA and is transmitted from the first optical DEMUX device to the first optical MUX device.

4. The system of claim 3, wherein the first wavelength selector system comprises:
a semiconductor optical amplifier (SOA) as part of each connection from the first plurality of connections.

5. The system of claim 4, wherein the second wavelength selector system comprises:
a second optical demultiplexer (DEMUX) device configured to receive and separate the second set of multi-wavelength signals into a plurality of signals; and
an output selector device configured to receive at least one of the plurality of signals from the second optical DEMUX device and output the final optical signal from the at least one of the plurality of signals.

6. The system of claim 5, wherein the second wavelength selector system comprises:
a semiconductor optical amplifier (SOA) as part of a connection from a second plurality of connections coupled with the second DEMUX device, wherein when the SOA is turned on by the controller, a signal passes through the SOA and is transmitted from the second optical DEMUX device to the output selector device.

7. The system of claim 5, wherein the output selector device comprises a second optical multiplexer (MUX) device or a reflector device.

8. The system of claim 4, wherein the second wavelength selector system comprises:
one or more micro-ring resonators (MRRs), each MRR coupled to the first wavelength selector system and configured to:
receive the second set of multi-wavelength signals; and
select and output the final optical signal from the second set of multi-wavelength signals.

9. The system of claim 8, wherein each MRR is coupled to a respective SOA to select and output the final optical signal.

10. The system of claim 8, wherein the one or more MRRs comprises two tunable MRRs, and wherein when one of the two tunable MRRs is in operation to select the final optical signal of a specific wavelength, the other of the two tunable MRRs is being tuned for selection of a next wavelength.

11. The system of claim 8, wherein the one or more MRRs are coupled to a second optical multiplexer (MUX) device or a reflector device.

12. A system in an optical network, comprising:
an optical demultiplexer (DEMUX) having a first input port and a plurality of output ports, the first input port configured to receive a first set of multi-wavelength signals and the plurality of output ports configured to output a plurality of group of signals, each group of signals being output from a respective port from the plurality of output ports depending on a wavelength channel;
a plurality of MRR channel selectors, each MRR channel selector being coupled to a respective port from the plurality of output ports of the optical DEMUX and configured to select a signal of a specific wavelength from a respective group of signals from the coupled respective port;
an optical MUX device or a reflector device coupled to the plurality of MRR channel selectors and configured to output a final optical signal from the output of the plurality of MRR channel selectors; and
a controller coupled to the plurality of MRR channel selectors, wherein the controller is configured to control the plurality of MRR channel selectors to select the final optical signal.

13. The system of claim 12, wherein each MRR channel selector comprises one or more micro-ring resonators (MRRs), each MRR coupled to the respective port from the plurality of output ports of the optical DEMUX and configured to:
receive the respective group of signals from the coupled respective port; and
select and output the final optical signal from the respective group of signals.

14. The system of claim 13, wherein each MRR is coupled to a respective SOA to select and output the final optical signal.

15. The system of claim 13, wherein each MRR channel selector comprises two tunable MRRs, and wherein when one of the two tunable MRRs is in operation to select the final optical signal of a specific wavelength, the other of the two tunable MRRs is being tuned for selection of a next wavelength.

16. A method for selecting a signal of a specific wavelength from a set of multi-wavelength signals, comprising:
receiving a first set of multi-wavelength signals by a first optical DEMUX device;
separating the first set of multi-wavelength signals into a plurality of groups of signals depending on a wavelength channel by the first optical DEMUX device;
selecting a group of signals from the plurality of groups of signals by a SOA;
outputting the selected group of signals by a first optical MUX device that is coupled to the first optical DEMUX device and the SOA;
receiving the selected group of signals by a wavelength selector system that is coupled to the first optical MUX device; and
selecting and outputting a final optical signal of a specific wavelength from the selected group of signals by the wavelength selector system.

17. The method of claim 16, wherein the wavelength selector system comprises a second optical DEMUX device, a SOA and an output selector device, and wherein selecting and outputting the final optical signal of a specific wavelength from the selected group of signals comprises:
receiving the selected group of signals by the second optical DEMUX device coupled to the first optical MUX device;
selecting the final optical signal of the specific wavelength by the SOA coupled to the second optical DEMUX device; and
outputting the final optical signal by the output selector device coupled to the second optical DEMUX device.

18. The method of claim 17, wherein the output selector device comprises a second optical MUX device or a reflector device.

19. The method of claim 16, wherein the wavelength selector system comprises two tunable MRRs and an output selector device, and wherein selecting and outputting the final optical signal of a specific wavelength from the selected group of signals comprises:
receiving the selected group of signals by the two tunable MRRs coupled to the first optical MUX device;
selecting the final optical signal of the specific wavelength by the two tunable MRRs; and
outputting the final optical signal by the output selector device coupled to the two tunable MRRs.

20. The method of claim 19, wherein the wavelength selector system comprises two SOAs, with each SOA coupled to a respective tunable MRR, and wherein the method comprises providing a power gain by at least one of the two SOAs to amplify the final optical signal.

* * * * *

UNITED STATES PATENT AND TRADEMARK OFFICE
CERTIFICATE OF CORRECTION

PATENT NO. : 11,388,491 B2
APPLICATION NO. : 17/079323
DATED : July 12, 2022
INVENTOR(S) : Zhiping Jiang Page 1 of 1

It is certified that error appears in the above-identified patent and that said Letters Patent is hereby corrected as shown below:

In the Specification

Column 4, Line 62; Column 5, Line 26; Column 8, Lines 58 and 59; Column 9, Lines 10 and 16; Column 10, Line 62; and Column 11, Line 5; the term "ins" should read --1ns--.

Signed and Sealed this
Twenty-seventh Day of September, 2022

Katherine Kelly Vidal
*Director of the United States Patent and Trademark Office*